(12) United States Patent
Tsuchi

(10) Patent No.: US 7,576,674 B2
(45) Date of Patent: Aug. 18, 2009

(54) DIGITAL-TO-ANALOG CONVERTER CIRCUIT, DATA DRIVER, AND DISPLAY DEVICE USING THE DIGITAL-TO-ANALOG CONVERTER CIRCUIT

(75) Inventor: Hiroshi Tsuchi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/979,347

(22) Filed: Nov. 1, 2007

(65) Prior Publication Data

US 2008/0211703 A1  Sep. 4, 2008

(30) Foreign Application Priority Data

Nov. 2, 2006  (JP) .............................. 2006-299246

(51) Int. Cl.
  *H03M 1/66*  (2006.01)
(52) U.S. Cl. ...................... 341/144; 341/138
(58) Field of Classification Search ................. 341/144, 341/138, 139, 122
  See application file for complete search history.

(56) References Cited

U.S. PATENT DOCUMENTS

| | | | |
|---|---|---|---|
| 4,978,959 A * | 12/1990 | Chong et al. ................ | 341/161 |
| 5,396,245 A | 3/1995 | Rempfer | |
| 5,859,606 A | 1/1999 | Schrader et al. | |
| 6,246,351 B1 | 6/2001 | Yilmaz | |
| 6,266,040 B1 | 7/2001 | Nagatomo | |
| 6,373,419 B1 | 4/2002 | Nakao | |
| 6,441,763 B1 | 8/2002 | Nakao | |
| 6,469,647 B1 | 10/2002 | Kinugasa et al. | |
| 6,707,442 B2 | 3/2004 | Watanabe | |

(Continued)

FOREIGN PATENT DOCUMENTS

JP  11-184444  7/1999

(Continued)

OTHER PUBLICATIONS

Japanese Office Action dated Sep. 1, 2008 with partial English-Language Translation.

(Continued)

*Primary Examiner*—Peguy JeanPierre
(74) *Attorney, Agent, or Firm*—McGinn IP Law Group, PLLC

(57) ABSTRACT

Disclosed is a data driver including a reference voltage generation circuit that generates and outputs a plurality of reference voltages, a decoder circuit that selects from among the reference voltages n (where n is an integer greater than or equal to two) reference voltages inclusive of reference voltages that may be identical and outputs the n reference voltages from n output terminals thereof, and an amplifying circuit that includes n differential circuits, a feedback resistor, and a resistor. The n output terminals are connected to non-inverting input terminals of the n differential circuits, respectively. The amplifying circuit outputs an output voltage obtained by operating and synthesizing the n reference voltages. One end of the feedback resistor is connected to an output terminal of the amplifying circuit, and the other end is connected to inverting input terminals of the n differential circuits connected in common. The resistor is connected between a voltage supply and the commonly coupled inverting input terminals of the n differential circuits.

17 Claims, 15 Drawing Sheets

$V_{out} = (1+R_f/R_1) \cdot \{(V_1+V_2+\cdots+V_n)/n - V_{SS}\} + V_{SS}$

U.S. PATENT DOCUMENTS 6,937,178 B1 8/2005 Rempfer et al.
7,236,114 B2 * 6/2007 Ahn .......................... 341/144

FOREIGN PATENT DOCUMENTS

| JP | 2000-183747 | 6/2000 |
|----|-------------|--------|
| JP | 2001-125543 | 5/2001 |
| JP | 2002-43944  | 2/2002 |
| JP | 2002-062852 | 2/2002 |

OTHER PUBLICATIONS

Japanese Office Action dated Apr. 24, 2009 with Partial English Translation.

* cited by examiner

Vout = Vin ( 1 + RfA/R1A )

<GRAY SCALE CHARACTERISTIC>

Vout = VE + (RfB/R1B)(VE − Vin)

Vofc = Vout − Vexp ps/cellular
DIGITAL-TO-ANALOG CONVERTER CIRCUIT, DATA DRIVER, AND DISPLAY DEVICE USING THE DIGITAL-TO-ANALOG CONVERTER CIRCUIT

RELATED APPLICATION

This application is based upon and claims the benefit of the priority of Japanese patent application No. 2006-299246, filed on Nov. 2, 2006, the disclosure of which is incorporated herein in its entirety by reference thereto.

FIELD OF THE INVENTION

The present invention relates to a digital-to-analog converter circuit, a data driver, and a display device using the digital-to-analog converter circuit.

BACKGROUND OF THE INVENTION

Recently, a demand for liquid crystal display devices for use in large-screen liquid crystal TV sets as well as for use in portable telephones (such as mobile phones or cellular phones), notebook PCs, and monitors has expanded. As these liquid crystal display devices, an active matrix driving liquid crystal display device capable of performing high-definition display is employed. First, referring to FIG. 11, a typical configuration of the active matrix driving liquid crystal display device will be outlined. FIG. 11 schematically shows a main configuration connected to a pixel in a liquid crystal display unit, using an equivalent circuit.

Generally, a display unit 960 of the active matrix driving liquid crystal display device includes a semiconductor substrate, an opposing substrate, and a liquid crystal sealed in between these two substrates by opposing these two substrates. On the semiconductor substrate, transparent pixel electrodes 964 and thin-film transistors (TFTs) 963 are arranged in a matrix form (of 1280×3 pixel rows×1024 pixel columns in the case of a color SXGA panel, for example). One transparent electrode 967 is formed on an entire surface of the opposing substrate.

A TFT 963 having a switching function is on/off-controlled by a scan signal. When the TFT 963 is turned on, a gray scale signal voltage corresponding to a video data signal is applied to a pixel electrode 964. Transmittance of the liquid crystal is changed by a potential difference between each pixel electrode 964 and the opposing substrate electrode 967, and even after the TFT 963 has been turned off, the potential difference is held by a liquid crystal capacitance 965 and an auxiliary capacitance 966 for a certain period, thereby displaying an image.

On the semiconductor substrate, data lines 962 and scan lines 961 are wired in the form of grids (in which 1280×3 data lines and 1024 scan lines are arranged in the case of the color SXGA panel). A data line 962 sends a plurality of level voltages (gray scale signal voltages) applied to each pixel electrode 964, and a scan line 961 sends the scan signal. Due to a capacitance produced at an intersection between each of the scan lines 961 and each of the data lines 962 and a liquid crystal capacitance sandwiched between the semiconductor substrate and the opposing substrate, the scan lines 961 and the data lines 962 have become a large capacitive load.

The scan signal is supplied to a scan line 961 from a gate driver 970, and a gray scale signal voltage is supplied to each pixel electrode 964 from a data driver 980 through a data line 962. The gate driver 970 and the data driver 980 are controlled by a display controller 950. A clock CLK, a control signal, and a voltage supply that are necessary are supplied from the display controller 950 to each of the gate driver 970 and the data driver 980, and video data is supplied to the data driver 980. Currently, digital data has been predominantly used as the video data.

Rewriting of data of one screen is performed in one frame period (of approximately 0.017 seconds, usually). Data is successively selected every pixel row (every line) by each scan line, and a gray scale voltage signal is supplied from each data line within a selection period.

While it suffices for the gate driver 970 to supply at least the scan signal of a binary value, the data driver 980 needs to drive a data line by the gray scale voltage signal of multi-valued levels according to the number of gray scales. For this reason, the data driver 980 includes a decoder that converts the video data to an analog voltage and a digital-to-analog converter circuit (DAC) formed of an operational amplifier that amplifies the analog voltage and outputs the amplified analog voltage to a corresponding data line 962.

Recently, liquid crystal display devices have become larger in size and the number of colors (gray scales) used in the liquid crystal display devices has also increased. In a liquid crystal TV, approximately 16,800 thousand colors (video data of eight bits for each of colors R, G, B) to ten hundred of million colors (video data of ten bits for each of the colors R, G, B) are demanded. Among data drivers that implement the increase in the number of gray scales described above, some of the data drivers including a DAC that outputs a linear voltage (hereinafter written as a linear DAC) of bits larger than the number of bits that can be displayed by the liquid crystal display device (in which the number of gray scales being equal to 2 to the power of the number of bits) by two to three bits is being on the market. While a commonly used DAC of the data driver has a nonlinear gray scale-voltage characteristic due to a gamma characteristic of the liquid crystal, the linear DAC has a linear gray scale-voltage characteristic in which the number of gray scales is four to eight times the number of gray scales of the usual data driver. By assigning a gray scale suited to the gamma characteristic from among a great number of linear output levels, display can be implemented. For this reason, the data driver including the linear DAC has a data conversion circuit that converts bit data (such as 10-bit data) of an image source to bit data (such as 12-bit data) of the linear DAC according to the gamma characteristic of the liquid crystal and can accommodate a different liquid crystal gamma characteristic just by changing a conversion table. The data driver including the linear DAC thus can be used as a general-purpose driver.

However, there is a problem that the circuit size of the DAC will increase due to an increase in the number of bits, and the chip area of a data driver LSI will be thereby increased, which results in a high cost. In conventional DACs, it is a common practice to select one voltage corresponding to video data by a decoder from among reference voltages the number of which is the same as the number of gray scales for display and to amplify the selected voltage by a voltage follower circuit (not shown). When video data is increased in bit width from eight bits to 10 bits, for example, the number of the reference voltages becomes four times, and the circuit size becomes four times or larger. When the linear DAC is employed, the circuit size is further increased to be four to eight times the circuit size of a conventional DAC.

Some configurations for restricting an increase in the area of the DAC against an increase in the number of bits have been already proposed. In each of Patent Documents 1 and 2, which will be listed later, there is proposed a DAC configuration for a display device in which using an operational amplifier that interpolates (internally divides) two reference voltages at a predetermined ratio, the number of reference voltages to be input to a DAC is reduced to a half or one quarter of the number of gray scales for display, thereby reducing the area of the DAC. In Patent Document 3, which will be listed later, there is proposed a configuration that greatly reduces the area of a DAC as an interpolating DAC. The DAC configuration in each of Patent Documents 1 and 2 is based on the configuration in Patent Document 3. In Patent Document 4, which will be listed later, there is proposed a DAC configuration aimed at improvement of an output voltage accuracy of the interpolating DAC. The same basic principle for saving the DAC area is used in Patent Documents 1 to 4. Patent Document 4, which will be listed later, will be described below as a representative of the configurations for restricting an increase in the DAC area.

FIG. 12 is a diagram showing the DAC configuration proposed in Patent Document 4. Referring to FIG. 12, this DAC includes a resistor string 93 and a decoder 92. The resistor string 93 outputs first through (m+1)th reference voltages VR0 to VRm that have mutually different potentials from first through (m+1)th taps thereof, respectively. The decoder 92 receives the (m+1) reference voltages VR0 to VRm, selects adjacent two reference voltages according to an input data signal, and outputs one of the selected two reference voltages to each of first to fourth decoder output terminals. The decoder 92 is constituted from a first group, a second group, and a third group of switches. The first group of switches is constituted from m switches S1a to Sma. In each of the switches S1a to Sma, a first terminal is connected to a tap for a corresponding one of the m reference voltages VR0 to VR(m−1). Second terminals of the switches S1a to Sma are coupled together. The first group of switches selects one reference voltage Va from among the m reference voltages VR0 to VR(m−1) and outputs the selected one reference voltage Va to a second terminal of each of the m switches S1a to Sma. The second terminals of the m switches S1a to Sma constitute the first decoder output terminal. The second group of switches is constituted from m switches S1b to Smb. In each of the switches S1b to Smb, a first terminal is connected to a tap for a corresponding one of m reference voltages VR1 to VRm. Second terminals of the switches S1b to Smb are coupled together. The second group of switches selects a higher level reference voltage Vb adjacent to the reference voltage Va. The third group of switches is constituted from selector switches SW1, SW2, and SW3 each of which controls connection between one of the second terminals of the first group of switches and the second terminals of the second group of switches and a corresponding one of the second to fourth decoder output terminals. The third group of switches selects one of the reference voltages Va and Vb and supplies the selected voltage to the second to fourth decoder output terminals, respectively. The DAC in FIG. 12 further includes an amplifying circuit 91 that receives outputs of the first to fourth decoder output terminals.

The amplifying circuit 91 includes four differential pairs (Q0A, Q0B), (Q1A, Q1B), (Q2A, Q2B), and (Q3A, Q3B), each of which is driven by an individual current source. Output pairs of the four differential pairs (Q0A, Q0B), (Q1A, Q1B), (Q2A, Q2B), and (Q3A, Q3B) are connected in common to input and output pairs of a current mirror circuit (QL1, QL2). Further, output signals of the four differential pairs (Q0A, Q0B), (Q1A, Q1B), (Q2A, Q2B), and (Q3A, Q3B) are differentially input to a differential amplifier 901 to output an output voltage Vout to an output terminal.

One (a second input) of an input pair of each of the four differential pairs (Q0A, Q0B), (Q1A, Q1B), (Q2A, Q2B) and (Q3A, Q3B) is connected in common to the output terminal, thereby forming a feedback configuration.

With respect to the other (a first input) of an input pair of each of the four differential pairs (Q0A, Q0B), (Q1A, Q1B), (Q2A, Q2B), and (Q3A, Q3B), the first input (a gate of a transistor Q0A) of the differential pair (Q0A, Q0B) is connected to the first decoder output terminal from which the reference voltage Va is output. First inputs (gates of transistors Q1A, Q2A, and Q3A) of the remaining three differential pairs (Q1A, Q1B), (Q2A, Q2B), and (Q3A, Q3B) are respectively connected to the second to fourth decoder output terminals from which one of the reference voltages Va and Vb is output, respectively.

The DAC in FIG. 12 generally operates as follows.

First, using an output of an MSB (Most Significant Bit) subword decoder 94 based on higher-order bit signals of input data, the kth switches (Ska and Skb) of the first and second groups of switches (S1a, . . . Sma) and (S1b, . . . Smb) are turned on, thereby selecting reference voltages at adjacent taps as the reference voltages Va and Vb. Then, by an output of an LSB (Least Significant Bit) subword decoder 95 based on lower-order bit signals of the input data, switching of the third group of switches (SW1, SW2, SW3) is further controlled.

According to a selecting condition in the third switches (SW1, SW2, SW3), one of four level voltages obtained by internally dividing the reference voltages Va and Vb at one of different ratios 0:1 (determined when the switches SW1, SW2, and SW3 all select the reference voltage Va), 1:3 (determined when one of the switches SW1, SW2, and SW3 selects the reference voltage Vb, and the other two switches select the reference voltage Va), 1:1 (determined when two of the switches SW1, SW2, and SW3 select the reference voltage Vb, and the other one switch selects the reference voltage Va), and 3:1 (determined when the switches SW1, SW2, and SW3 all select the reference voltage Vb) is output to the output terminal.

It is known from Patent Document 5, which will be listed later, that the output voltage of the amplifying circuit 91 has a characteristic of assuming an average value of voltages V0A, V1A, V2A, and V3A input to the gates of the transistors Q0A, Q1A, Q2A, and Q3A, respectively, or Vout=(V0A+V1A+V2A+V3A)/4. The operation described above is therefore evident from this fact.

In order to linearly output the four level voltages with a high voltage accuracy, it is necessary that the four differential pairs (Q0A, Q0B), (Q1A, Q1B), (Q2A, Q2B), and (Q3A, Q3B) should be formed of the transistors of the same size and that currents from the current sources for driving the four differential pairs respectively should also be controlled to be equivalent.

By the configuration and switch control as described above, the DAC in FIG. 12 can output a total of 4 m level voltages using the MSB and LSB subword decoders. When the number of the differential pairs in the amplifying circuit 91 is set to n, the DAC in FIG. 12 can output n×m level voltages to the output terminal.

When this principle on the DAC is used, the circuit size of the DAC or the area of the DAC can be greatly reduced, even if the number of bits of video data for the liquid crystal display device is greatly increased.

Other configurations for reducing the area of a DAC are proposed in Patent Document 6, which will be listed later. The configurations in Patent Document 6 are the configurations in each of which by employing an amplifying circuit having an amplification factor thereof being larger than one, a decoder is formed of a low voltage circuit, thereby reducing the area of the DAC. FIGS. 13A and 13B and FIGS. 14A and 14B are diagrams and graphs respectively showing configurations of amplifying circuits proposed in Patent Document 6 and input and output characteristics of the amplifying circuits.

FIG. 13A shows a configuration of a generally known non-inverting amplifying circuit. A voltage Vin is input to a non-inverting input terminal (+) of an amplifier 910, and an inverting input terminal (−) is connected to a connecting point between resistances Rfa and R1A connected in series between an output terminal Vout and a reference voltage supply GND. An output voltage Vout is given as follows:

$$Vout = Vin \times (1 + RfA/R1A).$$

The amplifier 910 can therefore output a voltage with the voltage amplification factor thereof being larger than one, according to a resistance ratio between the references RfA and R1A.

FIG. 13B is a graph showing the input-output characteristic in dot inversion driving when the non-inverting amplifying circuit in FIG. 13A is employed. Currently, the dot inversion driving scheme with high-image-quality driving is adopted in almost all large-sized liquid crystal display devices. In the dot inversion driving scheme, a voltage VCOM of an opposing substrate electrode of a liquid crystal panel is made constant, so that a data driver needs to output gray scale voltages of both of positive and negative polarities for the voltage VCOM. Accordingly, an output circuit of the data driver of the dot inversion driving, is provided with at least two voltage supplies having a potential difference that is approximately two times the maximum value of a liquid crystal application voltage (which is a potential difference between a gray scale voltage and the voltage VCOM). When negative and positive polarity voltage-gray scale characteristics to be output from the amplifier 910 in FIG. 13B are indicated by L93 and L94, respectively, the input voltage Vin can be reduced by setting the voltage amplification factor of each of the positive-polarity and negative-polarity voltage-gray scale characteristics based on the resistance ratio between the resistances RfA and R1A. More specifically, when voltage-gray scale characteristics input to the amplifier 910 are indicated by L91 and L92, the decoder that selects an input signal to the amplifier 910 can be formed of the low voltage circuit. With this arrangement, even if the number of devices that form the decoder remains unchanged, the area of the DAC can be reduced by reducing the size of each transistor.

FIG. 14A shows a configuration different from the configuration in FIG. 13A, which is the configuration of an amplifying circuit in which switching between an inverting amplifier and a voltage follower can be made by switch control.

When each of selector switches SW1, SW2, SW3, and SW4 is connected to a switching terminal 1, a voltage VE is input to a non-inverting input terminal (+) of an amplifier 920, and an inverting input terminal (−) is connected to a connecting point between a resistance RfB and a resistance R1B connected in series between an output terminal Vout and an input terminal to which a voltage Vin is supplied.

An output voltage Vout in this case becomes as follows:

$$Vout = VE - (RfB/R1B) \times (Vin - VE)$$
$$= VE + (RfB/R1B) \times (VE - Vin)$$

The amplifier 920 thus can output a voltage with the voltage amplification factor thereof being larger one, according to a resistance ratio between the resistance RfB and the resistance R1B.

On the other hand, when each of the selector switches SW1, SW2, SW3, and SW4 is connected to a switching terminal 2, the voltage Vin is input to the non-inverting input terminal (+) of the amplifier 920, and the inverting input terminal (−) is connected to the output terminal Vout. The output voltage Vout in this case becomes as follows:

$$Vout = Vin$$

FIG. 14B is a graph showing the input and output characteristics in the dot inversion driving when the amplifying circuit in FIG. 14A is employed. When negative-polarity and positive-polarity voltage-gray scale characteristics to be output from the amplifier 920 in FIG. 14B are indicated by L95 and L96, respectively, the input voltage Vin can be reduced by setting the voltage amplification factor of the positive-polarity voltage-gray scale characteristic based on the resistance ratio between the resistances RfB and R1B. More specifically, when an input voltage-gray scale characteristic of the amplifier 920 is indicated by L94, the decoder that selects an input signal to the amplifier 920 can be formed of the low voltage circuit. With this arrangement, even if the number of devices that form the decoder remains unchanged, the area of the DAC can be reduced by reducing the size of each device. Incidentally, when gamma characteristics of the negative-polarity voltage-gray scale characteristic L95 and the positive-polarity voltage-gray scale characteristic L96 are different according to the polarity, the input voltage-gray scale characteristic of the amplifier 920 differs according to the polarity.

[Patent Document 1]
Japanese Patent Kokai Publication No. JP-P2000-183747A (FIGS. 1 and 2)
[Patent Document 2]
Japanese Patent Kokai Publication No. JP-P2002-43944A (FIGS. 1 and 2)
[Patent Document 3]
U.S. Pat. No. 5,396,245 (FIG. 5)
[Patent Document 4]
U.S. Pat. No. 6,246,351 (FIG. 2)
[Patent Document 5]
U.S. Pat. No. 4,978,959 (Seventh Paragraph)
[Patent Document 6]
Japanese Patent Kokai Publication No. JP-A-11-184444 (FIGS. 1 and 4)

SUMMARY OF THE DISCLOSURE

The entire disclosure of Patent Documents 1-6 is incorporated herein by reference thereto.

As described above, when the number of the differential pairs that form the amplifying circuit 91 is increased in the DAC in FIG. 12, an increase in the number of the reference voltages can be restricted. As a result, an increase in the area of the DAC can be prevented. When a linear 12-bit DAC is formed, for example, the number of the differential pairs of the amplifying circuit 91 should be set to 16 in order to restrict an increase in the area of a decoder, using the number of reference voltages comparable to the number of reference voltages in a conventional 8-bit DAC. The more the number of the differential pairs is increased, the more the number of the reference voltages is reduced. As a result, the area of the decoder that selects reference voltages can be greatly reduced.

An inventor of the present invention analyzes input and output characteristics of the amplifying circuit 91 including 16 differential pairs of (Q0A, Q0B), (Q1A, Q1B), . . . and (Q15A, Q15B) (not shown) by a simulation, and shows results of the simulation in FIGS. 15A, 15B, and 15C.

FIG. 15A is a graph showing a relationship between a gray scale level (plotted on a horizontal axis) and a linear DAC output voltage (plotted on a vertical axis). 16 gray scale levels are present between the adjacent reference voltages Va and Vb (which are the output voltages of the first and second groups of switches).

FIG. 15B is a graph showing an output error characteristic of the 16 gray scale levels between the reference voltages Va and Vb, output from the amplifying circuit 91. A horizontal axis indicates a voltage, while a vertical axis indicates an output error Vofc. The output error Vofc assumes a value obtained by subtracting an output expected value Vexp expressed by the following expression from the output voltage Vout of the amplifying circuit 91.

$$Vofc = Vout - Vexp$$

$$Vexp = Va + L \times (Vb - Va)/16$$

in which, L assumes a value of one of 0, 1, 2, . . . 15, corresponding to each of 16 gray scales for interpolation of the reference voltages Va and Vb. Incidentally, this output error Vofc is the output error caused by an operation of the amplifying circuit 91 and does not include an error caused by device characteristic variations resulting from a process or the like.

As seen from FIG. 15B, the output error Vofc of an interpolated output voltage of the two reference voltages Va and Vb has a characteristic that an absolute value thereof becomes maximum (=ΔVofc) in the vicinity of voltages which are one quarter and three quarters of a voltage obtained by subtracting the voltage Vb from the voltage Va. This result has the same characteristic as a result shown in FIG. 4 in Patent Document 4.

The analysis by the inventor of the present invention has newly confirmed that the maximum value ΔVofc of the output error in FIG. 15B depends on a voltage difference (Vb−Va) between the reference voltages Va and Vb.

A result of the confirmation is shown in FIG. 15C. A horizontal axis in FIG. 15C indicates the voltage difference (Vb−Va) between the reference voltages Va and Vb, which assumes 0 to 100 mV. A vertical axis indicates the output error maximum value ΔVofc.

As shown in FIG. 15C, with respect to an increase in the voltage difference (Vb−Va), the output error maximum value ΔVofc increases like a quadratic function. A value of the output error maximum value ΔVofc changes in some degree depending on a circuit design condition. The output error maximum value ΔVofc becomes approximately several mV when the voltage difference (Vb−Va) is 100 mV.

It is inferred that the output error characteristics in FIGS. 15B and 15C are caused by characteristic curves of the transistors that forms each differential pair and are defined by a quadratic function.

Accompanying a demand for a high image quality and an increase in the number of colors in a large-screen liquid crystal display device such as the liquid crystal TV, a voltage difference between supply voltages of 18V at the maximum and the maximum value of approximately 8.6V of a liquid crystal application voltage are demanded for a data driver in the device.

When 10-bit 1024 gray scale display is performed, for example, an average of one LSB in the usual DAC is approximately 8.4 mV. However, since the gamma characteristic is present, 3 to 4 mV, for example, is demanded as the minimum value of the one LSB. In a 12-bit linear DAC, one LSB becomes approximately 2.1 mV.

In an example described with reference to FIGS. 15A through 15C, the 16 gray scale levels are present between the adjacent reference voltages Va and Vb. Thus, a voltage difference between the adjacent reference voltages in the 12-bit linear DAC is approximately 34 mV. An output error caused by the operation in this case is 1 mV or less, which is considered to be sufficiently small. Actually, however, device variations resulting from the process and the like are added to this output error. Accordingly, there is a problem (a first problem) that a total output error may exceed one LSB (approximately 2.2 mV) and an increase in the output error or gray scale inversion may tend to occur.

When a configuration is employed in which 32 gray scale levels are present between the adjacent reference voltages Va and Vb, a voltage difference between the adjacent reference voltages in the 12-bit linear DAC becomes approximately 67 mV. Then, an output error caused by the operation reaches approximately 2 mV at the minimum, which is an unnegligible level.

Though the results shown in FIGS. 15A through 15C are obtained when the 16 differential pairs were used in the amplifying circuit 91 in FIG. 12, great reduction of the number of reference voltages is possible even if the number of the differential pairs is not greatly increased as described above.

The amplifying circuit 91 in FIG. 12 can output an average of voltages input to non-inverting input terminals of the differential pairs. Thus, by using reference voltages that are not adjacent to each other, for operation and output by the amplifying circuit 91, the number of reference voltages can be greatly reduced, even if the number of the differential pairs is not greatly increased. However, when the reference voltages that are not adjacent to each other are used, a voltage difference between the reference voltages input to the amplifying circuit 91 becomes an integer multiple of (Vb−Va). Then, an output error caused by the operation may be further increased, thereby causing the problem (first problem) such as the gray scale inversion. Accordingly, it is important to reduce the output error Vofc caused by the operation to a sufficiently small value.

On the other hand, in the case of the configurations in FIGS. 13A, 13B, 14A and 14B, the area of the DAC can be reduced by reducing the size of each device, though the number of the devices remains unchanged. However, when the linear 12-bit DAC is configured, for example, the number of reference voltages is increased to 16 times the number of reference voltages in the conventional 8-bit DAC. Even if the size of each device can be greatly reduced as the low-voltage circuit, the number of reference voltage lines (wires) greatly increases. However, usually, a reference value for design of a wire interval scarcely changes even if a device breakdown voltage changes. Thus, when the number of wires remarkably increases, the number of the wires determines the area of the DAC. That is, there is a problem (a second problem) of a great increase in the number of wires.

In FIGS. 13A and 13B, current flows from the output terminal Vout to the GND via the resistances R1A and RfA. In FIGS. 14A and 14B, current flows from the output terminal Vout to the input terminal Vin via the resistances R1B and RfB. For the positive-polarity gray scale voltages, in particular, a potential difference between the output terminal Vout and the GND or between the output terminal Vout and the input terminal Vin is larger than the maximum value of the liquid crystal application voltage. Thus, there is a problem (a third problem) that power consumption is large.

Further, referring to FIG. 14A, the switches SW1 and SW4 are connected in series with the resistances R1B and RfB in a current path. For this reason, the voltage amplification factor tends to change by an on resistance of each switch. There is therefore a problem (a fourth problem) that an output voltage accuracy is reduced.

Further, in the configuration in FIG. 14A in which each of the selection switches SW1 to SW4 is connected to the switching terminal 1, a current driving capability of an external circuit that supplies the input signal Vin is needed, and there is a problem (a fifth problem) that the external circuit cannot be configured as a simple circuit.

The invention disclosed in this application is generally configured as follows.

In accordance with an aspect of the present invention, there is provided a digital-to-analog converter circuit including:

a reference voltage generation circuit that generates and outputs a plurality of reference voltages;

a decoder circuit that receives the reference voltages, selects from among the reference voltages first to nth (where n is an integer greater than or equal to two) reference voltages inclusive of reference voltages that may be identical, based on an input digital signal, and outputs the first to nth reference voltages from first to nth output terminals thereof;

an amplifying circuit that receives the first to nth reference voltages and outputs a voltage obtained by weighted summation of the first to nth reference voltages; and an amplification factor control unit that controls a voltage amplification factor of the amplifying circuit.

More specifically, a digital-to-analog converter circuit in accordance with an aspect of the present invention includes:

a reference voltage generation circuit that generates and outputs a plurality of reference voltages;

a decoder circuit that receives the reference voltages, selects from among the reference voltages first to nth (where n is an integer greater than or equal to two) reference voltages inclusive of reference voltages that may be identical, based on an input digital signal, and outputs the first to nth reference voltages from first to nth output terminals thereof;

an amplifying circuit including:

first to nth differential circuits with first inputs of input pairs thereof connected to the first to nth output terminals of the decoder circuit, respectively; and an amplification stage that receives output currents of the first to nth differential circuits, and performs current to voltage conversion and amplification to output a voltage from an output terminal thereof; and an amplification factor control unit that controls a voltage amplification factor of the amplifying circuit, the amplification factor control unit being connected between the output terminal of the amplifying circuit and commonly coupled second inputs of the input pairs of the first to nth differential circuits.

In the present invention, the amplification factor control unit may include:

a first resistance element connected between the output terminal of the amplifying circuit and the commonly coupled second inputs of the input pairs of the first to nth differential circuits; and a second resistance element connected between a voltage supply and the commonly coupled second inputs of the input pairs of the first to nth differential circuits.

In the digital-to-analog converter circuit according to the present invention, the amplifying circuit outputs the voltage defined by a value obtained by averaging (weighted summation) of the first to nth reference voltages and the voltage amplification factor controlled by the amplification factor control unit.

In the digital-to-analog converter circuit according to the present invention, the reference voltage generation circuit includes:

a resistor string that outputs the reference voltages;

the decoder circuit includes:

groups of switches, each groups of switches receiving the reference voltages and performing selection between first and second reference voltages from among the reference voltages based on a value at a predetermined bit position of the input digital signal, the reference voltages being outputs of the resistor string; one of the selected first and second reference voltages being fixedly output from at least one output terminal of the decoder circuit; and selector switches each of which selects and outputs one of the first and second reference voltages based on a value at a bit position other than the value at the predetermined bit position of the input digital signal, the each of the selector switches being provided for each of output terminals other than said at least one output terminal among n output terminals of the decoder circuit.

In the digital-to-analog converter circuit according to the present invention, the reference voltage generation circuit may include a resistor string that outputs (m+1) reference voltages from first through (m+1)th (m being an integer equal to or greater than two) taps thereof;

the decoder circuit may include:

a first group of switches constituted from m switches, the first group of switches having first terminals thereof connected to the first to mth (the m being the integer equal to or greater than two) taps of the resistor string, respectively, one of the first group of switches being turned on based on a value at a predetermined bit position of the input digital signal, thereby selectively supplying a first reference voltage (Va) to commonly coupled second terminals of the first group of switches;

a second group of switches constituted from m switches, the second group of switches having first terminals thereof connected to the second to (m+1)th taps of the resistor string, respectively, one of the second group of switches being turned on based on the value at the predetermined bit position of the input digital signal, thereby selectively supplying a second reference voltage (Vb) to commonly coupled second terminals of the second group of switches; and (n−1) (the n being the integer equal to or greater than two) selector switches each of which switches and outputs one of the first reference voltage (Va) at a connecting node of the commonly coupled second terminals of the first group of switches and the second reference voltage (Vb) at a connecting node of the commonly coupled second terminals of the second group of switches, based on a value at a bit position other than the predetermined bit position of the input digital signal;

the connecting node of the commonly coupled second terminals of the first group of switches may constitute the first output terminal of the decoder circuit;

outputs of the (n−1) selector switches may constitute the second through nth output terminals of the decoder circuit, respectively; and non-inverting input terminals of the input pairs of the first to nth differential circuits may be connected to the first to nth output terminals of the decoder circuit, respectively, the non-inverting input terminals constituting the first inputs of the input pairs of the first to nth differential circuits.

In the amplifying circuit in the data driver according to the present invention, the first to nth differential circuits include first to nth differential pairs, the first to nth differential pairs being driven by corresponding current sources, respectively, first outputs of output pairs of the first to nth differential pairs being connected in common, second outputs of the output pairs of the first to nth differential pairs being connected in common, the output pairs being connected to a common load circuit; and the amplification stage includes an amplifying unit, an input terminal of the amplifying unit being connected to at least one of a connecting node between the first outputs of the output pairs of the first to nth differential pairs and the load circuit and a connecting node between the second outputs of the output pairs of the first to nth differential pairs and the load circuit, an output terminal of the amplifying unit being connected to the output terminal of the amplifying circuit.

In accordance with another aspect of the present invention, there is provided a data driver including:

(a) a positive-polarity reference voltage generation circuit that generates a plurality of positive-polarity reference voltages;

(b) a positive-polarity decoder that receives the positive-polarity reference voltages and outputs from first to nth output terminals thereof first to nth (where n is an integer greater than or equal to two) positive-polarity reference voltages inclusive of reference voltages that may be identical, selected from among the positive-polarity reference voltages based on a first input digital signal;

(c) a positive-polarity amplifier that receives the first to nth positive-polarity reference voltages and outputs a positive-polarity gray scale voltage from a positive-polarity output terminal thereof;

(d) a negative-polarity reference voltage generation circuit that generates a plurality of negative-polarity reference voltages;

(e) a negative-polarity decoder that receives the negative-polarity reference voltages and outputs from first to nth output terminals thereof first to nth (the n being the integer equal to or greater than two) negative-polarity reference voltages inclusive of reference voltages that may be identical, selected from among the negative-polarity reference voltages based on a second input digital signal;

(f) a negative-polarity amplifier that receives the first to nth negative-polarity reference voltages and outputs a negative-polarity gray scale voltage from a negative-polarity output terminal thereof; and (g) an output switch circuit that switches and controls whether to directly connect the positive-polarity output terminal and the negative-polarity output terminal to first and second data lines, respectively, without alteration, or to cross-connect the positive-polarity output terminal and the negative-polarity output terminal to the second data line and the first data line, respectively. In the present invention, the positive-polarity amplifier includes:

(c1) a positive-polarity amplifying circuit including:

first to nth positive-polarity differential circuits with first inputs of input pairs thereof connected to the first to nth output terminals of the positive-polarity decoder, respectively; and a first amplification stage that receives output currents of the first to nth positive-polarity differential circuits, and performs current to voltage conversion and amplification to output the positive-polarity gray scale voltage from the positive-polarity output terminal; and (c2) a positive-polarity amplification factor control unit including a first resistance element connected between the positive-polarity output terminal and commonly coupled second inputs of the input pairs of the first to nth positive-polarity differential circuits and a second resistance element connected between the commonly coupled second inputs of the input pairs of the first to nth positive-polarity differential circuits and a first voltage supply. The negative-polarity amplifier includes:

(f1) a negative-polarity amplifying circuit including:

first to nth negative-polarity differential circuits with first inputs of input pairs thereof connected to the first to nth output terminals of the negative-polarity decoder, respectively; and a second amplification stage that receives output currents of the first to nth negative-polarity differential circuits, and performs current to voltage conversion and amplification to output the negative-polarity gray scale voltage from the negative-polarity output terminal; and (f2) a negative-polarity amplification factor control unit including a third resistance element connected between the negative-polarity output terminal and commonly coupled second inputs of the input pairs of the first to nth negative-polarity differential circuits and a fourth resistance element connected between the commonly coupled second inputs of the input pairs of the first to nth negative-polarity differential circuits and a second voltage supply. A conductivity type of the differential circuits of the positive-polarity amplifier is different from a conductivity type of the differential circuits of the negative-polarity amplifier.

In the data driver according to the present invention, the positive-polarity amplifier outputs the voltage defined by a value obtained by averaging (weighted summation) of the first to nth positive-polarity reference voltages and a voltage amplification factor controlled by the positive-polarity amplification factor control unit; and the negative-polarity amplifier outputs the voltage defined by a value obtained by averaging (weighted summation) of the first to nth negative-polarity reference voltages and the voltage amplification factor controlled by the negative-polarity amplification factor control unit. Incidentally, when the first to nth positive-polarity reference voltages are only two positive-polarity reference voltages which are the first and second positive-polarity reference voltages, the positive-polarity amplifier outputs the voltage defined by a value obtained by internally dividing the first and second positive-polarity reference voltages and the voltage amplification factor controlled by the positive-polarity amplification factor control unit. When the first to nth negative-polarity reference voltages are only two negative-polarity reference voltages which are the first and second negative-polarity reference voltages, the negative-polarity amplifier outputs the voltage defined by a value obtained by internally dividing the first and second negative-polarity reference voltages and the voltage amplification factor controlled by the negative-polarity amplification factor control unit.

In the data driver according to the present invention, the positive-polarity reference voltage generation circuit includes a positive-polarity resistor string that outputs the positive-polarity reference voltages;

the negative-polarity reference voltage generation circuit includes a negative-polarity resistor string that outputs the negative-polarity reference voltages;

the positive-polarity decoder includes:

a first group of switches, the switches receiving the positive-polarity reference voltages, respectively, and respectively performing selection between first and second positive-polarity reference voltages from among the positive-polarity reference voltages, based on a value at a predetermined bit position of the first input digital signal, the positive-polarity reference voltages being outputs of the positive-polarity resistor string; the selected first positive-polarity reference voltage being fixedly output from at least one output terminal of the positive-polarity decoder; and first selector switches each of which selects and outputs one of the first and second positive-polarity reference voltages based on a value at a bit position other than the value at the predetermined bit position of the first input digital signal, the each of the first selector switches being provided for each of the output terminals other than said at least one output terminal among the n output terminals of the positive-polarity decoder circuit; and the negative-polarity decoder includes:

a second group of switches, the switches receiving the negative-polarity reference voltages, respectively, and respectively performing selection between first and second negative-polarity reference voltages from among the negative-polarity reference voltages, based on a value at a predetermined bit position of the second input digital signal, the negative-polarity reference voltages being outputs of the negative-polarity resistor string; the selected first negative-polarity reference voltage being fixedly output from at least one output terminal of the negative-polarity decoder; and second selector switches each of which selects and outputs one of the first and second negative-polarity reference voltages based on a value at a bit position other than the value at the predetermined bit position of the second input digital signal, the each of the second selector switches being provided for each of the output terminals other than said at least one output terminal among the n output terminals of the negative-polarity decoder.

In the data driver according to the present invention, the positive-polarity reference voltage generation circuit includes a positive-polarity resistor string that outputs (m+1) positive-polarity reference voltages from first through (m+1)th (m being an integer equal to or greater than two) taps thereof;

the negative-polarity reference voltage generation circuit includes a negative-polarity resistor string that outputs (m+1) negative-polarity reference voltages from first through (m+1)th (the m being the integer equal to or greater than two) taps thereof;

the positive-polarity decoder according to the present invention includes:

a first group of positive-polarity switches constituted from m switches, the first group of positive-polarity switches having first terminals thereof connected to the first to mth taps of the positive-polarity resistor string (the m being the integer equal to or greater than two), respectively, one of the first group of positive-polarity switches being turned on based on a value at a predetermined bit position of the first input digital signal, thereby supplying a first positive-polarity reference voltage (Va(+)) to commonly coupled second terminals of the first group of positive-polarity switches;

a second group of positive-polarity switches constituted from m switches, the second group of switches having first terminals thereof connected to the second to (m+1)th taps of the positive-polarity resistor string, respectively, one of the second group of positive-polarity switches being turned on based on the value at the predetermined bit position of the first input digital signal, thereby supplying a second positive-polarity reference voltage (Vb(+)) to commonly coupled second terminals of the second group of positive-polarity switches; and (n−1) (the n being the integer equal to or greater than two) positive-polarity selector switches each of which switches and outputs one of the first reference voltage (Va(+)) at a connecting node of the commonly coupled second terminals of the first group of positive-polarity switches and the second positive-polarity reference voltage (Vb(+)) at a connecting node of the commonly coupled second terminals of the second group of positive-polarity switches, based on a value at a bit position other than the predetermined bit position of the first input digital signal;

the connecting node of the second terminals of the first group of positive-polarity switches constituting the first output terminal of the positive-polarity decoder;

outputs of the (n−1) positive-polarity selector switches constituting the second through nth output terminals of the positive-polarity decoder, respectively;

non-inverting input terminals of the input pairs of the first to nth positive-polarity differential circuits being connected to the first to nth output terminals of the positive-polarity decoder, respectively, the non-inverting input terminals constituting the first inputs of the input pairs of the first to nth positive-polarity differential circuits; and the negative-polarity decoder includes:

a first group of negative-polarity switches constituted from m switches, the first group of negative-polarity switches having first terminals thereof connected to the first to mth (the m being the integer equal to or greater than two) taps of the negative-polarity resistor string, respectively, one of the first group of negative-polarity switches being turned on based on a value at a predetermined bit position of the second input digital signal, thereby supplying a first negative-polarity reference voltage (Va(−)) to commonly coupled second terminals of the first group of negative-polarity switches;

a second group of negative-polarity switches constituted from m switches, the second group of negative-polarity switches having first terminals thereof connected to the second to (m+1)th taps of the negative-polarity resistor string, respectively, one of the second group of negative-polarity switches being turned on based on the value at the predetermined bit position of the second input digital signal, thereby supplying a second negative-polarity reference voltage (Vb(−)) to second terminals of the commonly coupled second group of negative-polarity switches; and (n−1) (the n being the integer equal to or greater than two) selector switches each of which switches and outputs one of the first negative-polarity reference voltage (Va(−)) at a connecting node of the commonly coupled second terminals of the first group of negative-polarity switches and the second negative-polarity reference voltage (Vb(−)) at a connecting node of the commonly coupled second terminals of the second group of negative-polarity switches, based on a value at a bit position other than the predetermined bit position of the second input digital signal;

the connecting node of the commonly coupled second terminals of the first group of negative-polarity switches constituting the first output terminal of the negative-polarity decoder;

outputs of the (n−1) negative-polarity selector switches constituting the second through nth output terminals of the negative-polarity decoder, respectively;

non-inverting input terminals of the input pairs of the first to nth negative-polarity differential circuits being connected to the first to nth output terminals of the negative-polarity decoder, respectively, the non-inverting input terminals constituting the first inputs of the input pairs of the first to nth negative-polarity differential circuits.

In the positive-polarity amplifier in the data driver according to the present invention, the first to nth positive-polarity differential circuits include first to nth positive-polarity differential pairs driven by corresponding current sources, respectively, first outputs of output pairs of the first to nth positive-polarity differential pairs being connected in common and second outputs of the output pairs of the first to nth positive-polarity differential pairs being connected in common, the output pairs being connected in common to a first load circuit;

the amplification stage of the positive-polarity amplifying circuit includes a first amplifying unit, an input terminal of the first amplifying unit being connected to at least one of a connecting node between the first outputs of the output pairs of the first to nth positive-polarity differential pairs and the first load circuit and a connecting node between the second outputs of the output pairs of the first to nth positive-polarity differential pairs and the first load circuit, an output terminal of the amplifying unit being connected to the positive-polarity output terminal;

in the negative-polarity amplifier, the first to nth negative-polarity differential circuits include first to nth negative-polarity differential pairs driven by corresponding current sources, respectively, first outputs of output pairs of the first to nth negative-polarity differential pairs being connected in common and second outputs of the output pairs of the first to nth negative-polarity differential pairs being connected in common, the output pairs being connected in common to a second load circuit; and the amplification stage of the negative-polarity amplifying circuit includes a second amplifying unit, an input terminal of the second amplifying unit being connected to at least one of a connecting node between the first outputs of the output pairs of the first to nth negative-polarity differential pairs and the second load circuit and a connecting node between the second outputs of the output pairs of the first to nth negative-polarity differential pairs and the second load circuit, an output terminal of the amplifying unit being connected to the negative-polarity output terminal.

In the data driver according to the present invention, a high potential side voltage supply VDD and a low potential side voltage supply VSS may be supplied to the positive-polarity amplifier and the negative-polarity amplifier, respectively, as driving voltage supplies, and an opposing substrate electrode voltage VCOM of a display panel may be substantially intermediate between the high potential side voltage supply VDD and the low potential side voltage supply VSS. Alternatively, the reference voltage supply VSS close to the opposing substrate electrode voltage VCOM of the display panel may be prepared, and the reference voltage supply VSS and a high potential side voltage supply VDD2 higher than the reference voltage supply VSS may be supplied to the positive-polarity amplifier as a driving voltage supply, and the reference voltage supply VSS and a low potential side voltage supply VDD1 lower than the reference voltage supply VSS may be supplied to the negative-polarity amplifier as a driving voltage supply.

According to the present invention, a display device including the data driver described above is provided.

According to the present invention, there is provided an amplifying circuit comprising:

a plurality of differential pairs driven by a plurality of current sources, respectively, said differential pairs receiving signal voltages of a plurality of input terminals, respectively, first outputs of output pairs of said differential pairs being connected in common and second outputs of said output pairs of said differential pairs being connected in common;

an amplification stage that converts one of a sum of currents of the first outputs of said output pairs of said differential pairs connected in common, a sum of currents of the second outputs of said output pairs of said differential pairs, and a difference between the sum of the currents of the first outputs and the sum of the currents of the second outputs to a voltage and outputs the voltage from an output terminal thereof; and an amplification factor control unit that controls an amplification factor.

The meritorious effects of the present invention are summarized as follows.

According to the present invention, by including the amplification factor control unit in the amplifying circuit that constitutes a multi-valued output operational amplifier and by reducing an input voltage range when same output voltages are output, en error between each of the output voltage of the amplifying circuit and an expected value can be particularly reduced. A digital-to-analog converter circuit that implements a highly accurate voltage output is thereby provided.

According to the present invention, even if a factor for an output error caused by device variations is added, occurrence of gray scale inversion, which is a problem in a conventional art, can be prevented.

Further, according to the present invention, even if the number of bits of input data is greatly increased, a digital-to-analog converter circuit that implements area saving and a highly accurate voltage output using the small number of reference voltages is provided.

Further, according to the present invention, using the digital-to-analog converter circuit described above, a data driver for a display device that achieves lower power consumption and more area saving (lower cost) than in a conventional system is provided.

According to the present invention, by using the data driver described above, the display device at low cost is provided.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

BRIEF DESCRIPTIONS OF THE DRAWINGS

PREFERRED MODES OF THE INVENTION

The description of the present invention will be given below with reference to appended drawings.

Figure 1:
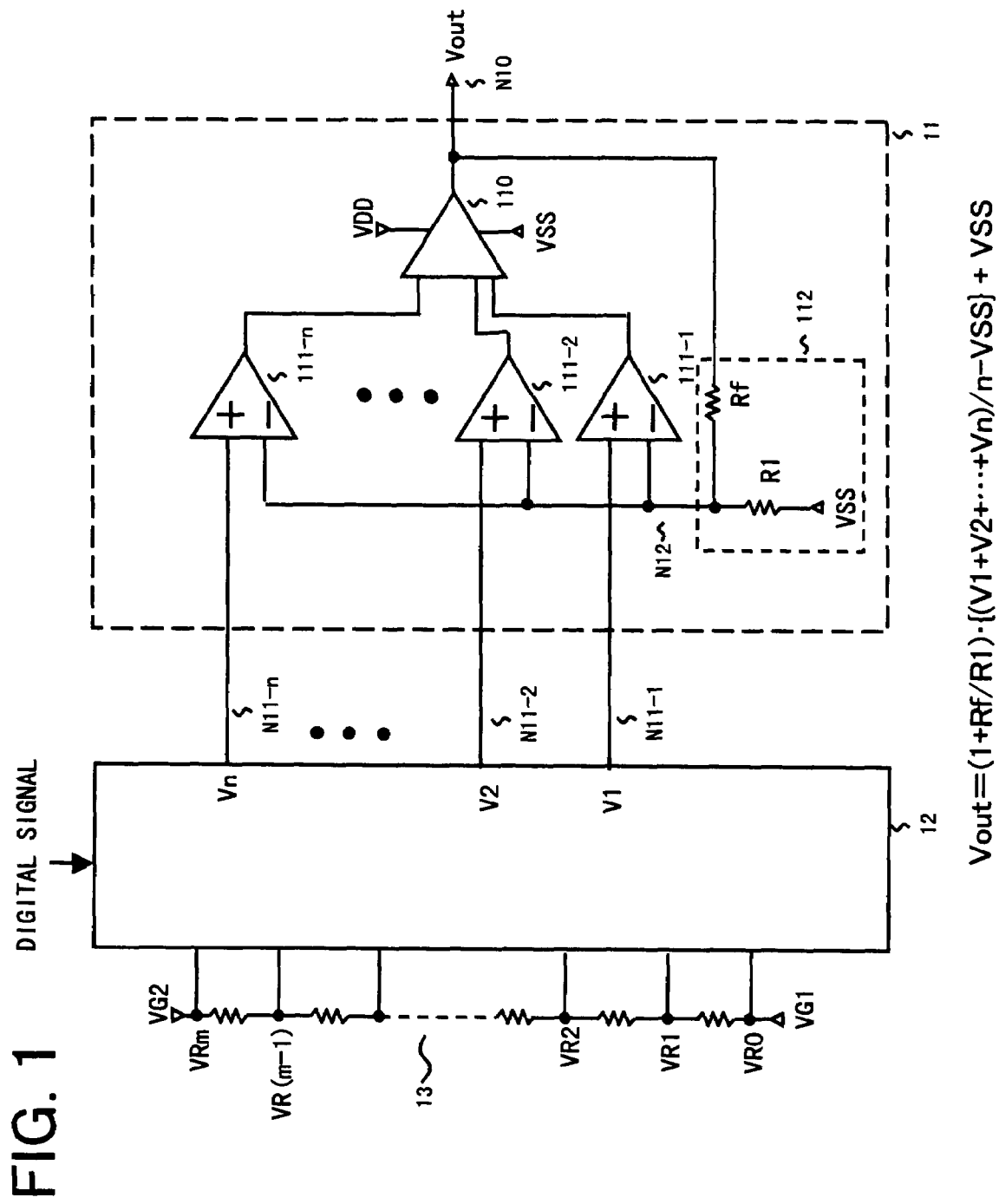
FIG. 1 is a diagram showing a configuration of a DAC in an embodiment mode of the present invention.

FIG. 1 is a diagram showing a configuration of a digital-to-analog converter circuit (DAC) in a first embodiment of the present invention. Referring to FIG. 1, this DAC includes a reference voltage generation circuit 13, a decoder 12, and an amplifying circuit 11. The reference voltage generation circuit 13 is formed of a resistor string. To both ends of the resistor string, voltages VG1 and VG2 are supplied, respectively, and (m+1) reference voltages VR0 to VRm that are different to one another are output from respective taps of the resistor string. The decoder 12 selects n reference voltages inclusive of reference voltages that may be identical, from among the (m+1) reference voltages VR0 to VRm responsive to an input digital signal and outputs the selected reference voltages to terminals N11-1 to N11-n as reference voltages V1 to Vn, respectively. The amplifying circuit 11 amplifies and outputs an output voltage Vout to an output terminal N10, based on the n reference voltages V1 to Vn.

The amplifying circuit 11 is configured by including n differential units (differential circuits) 111-1 to 111-n that receive the n reference voltages V1 to Vn at first terminals (non-inverting input terminals) of input pairs thereof, respectively, an amplifying unit 110 that adds (performs weighted summation of) output currents of the respective differential units 111-1 to 111-n, thereby performing current to voltage conversion and amplification, and an amplification factor control unit 112. The amplification factor control unit 112 is connected between the output terminal N10 and second terminals (inverting input terminals) N12 of the n differential units 111-1 to 111-n connected in common. The amplification factor control unit 112 sets an amplification factor for a voltage to be amplified and output to the output terminal N10 to a predetermined amplification factor larger than 1, based on a voltage at the terminals N12.

The amplification factor control unit 112 is formed of a resistor (feedback resistor) Rf connected between the terminal N12 and the output terminal N10 and a resistor R1 connected between the terminal N12 and a power supply VSS. The resistors R1 and Rf assume values other than zero.

The output voltage Vout of the amplifying circuit 11 is given by the following expression (1):

$$V\text{out}=(1+Rf/R1)\times\{(V1+V2+\ldots+Vn)/n-VSS\}+VSS \quad (1)$$

According to expression (1), the output voltage Vout becomes a value obtained by multiplying a voltage difference between an average value of the n voltages V1 to Vn and a voltage supply VSS by a voltage amplification factor (1+Rf/R1) and further adding the voltage supply VSS to the value obtained by the multiplication.

When the resistor Rf is equal to the resistor R1 and the supply voltage VSS is equal to a GND voltage, for example, Vout becomes as follows:

$$V\text{out}=2\times(V1+V2+\ldots+Vn)/n.$$

A voltage which is twice the average value of the n voltages V1 to Vn (with the voltage amplification factor being two) is output.

It means that for an input range of the n voltages V1 to Vn, the amplifying circuit 11 can expand an output range by controlling the voltage amplification factor to be larger than one, using the amplification factor control unit 112.

In other words, it means that for the predetermined output range, the input range of the n voltages V1 to Vn can be reduced. Then, a voltage range of the reference voltages VR0 to VRm can be reduced.

As described above, in the DAC in this embodiment, the differential units are provided. The number of reference voltages can be thereby reduced, and the voltage range of the respective reference voltages can also be reduced.

As a result, the device size of each transistor constituting the decoder 12 can be reduced, and the number of wires can also be reduced. Area saving can be thereby implemented.

Figure 15A:
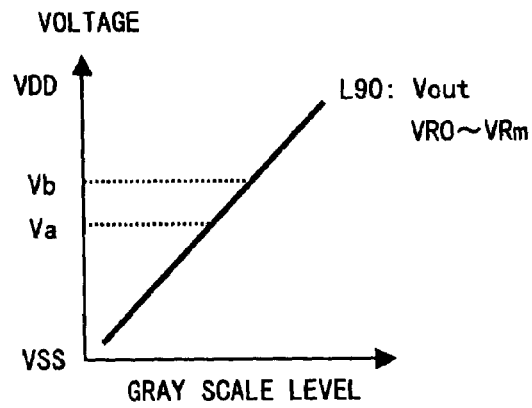
FIGS. 15A, 15B, and 15C are graphs showing results of a simulation of inputs and output characteristics of an amplifying circuit in FIG. 12.
Figure 15B:
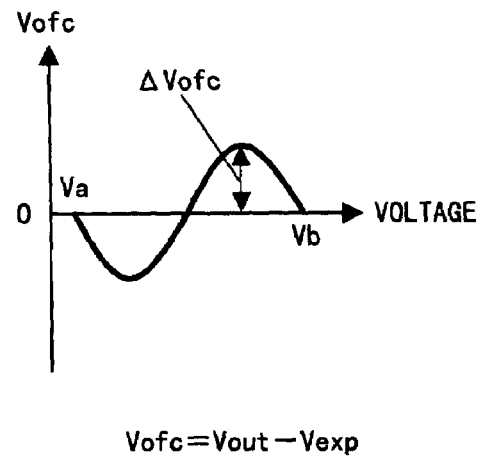
Figure 15C:
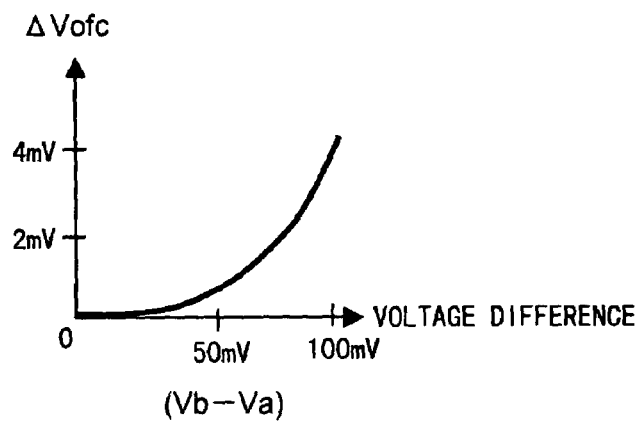

Dependency of an output error caused by an operation on a potential difference between reference voltages as shown in FIG. 15C occurs in current summation and current to voltage conversion by the amplifier unit 110. In the DAC in this embodiment, shown in FIG. 1, a potential difference between the reference voltages to be operated becomes sufficiently small. Accordingly, an output error component caused by the operation of the amplifier unit 110 is sufficiently reduced. For this reason, even if a factor for an output error caused by device variations is added, a problem of gray scale inversion that has arisen due to a configuration in FIG. 12 can be prevented. More specifically, as described before, in an example shown in FIG. 15, a maximum value Δ Vofc of an output error Vofc increases like a quadratic function, with respect to a voltage difference (Vb−Va) of two reference voltages in an example of a conventional art in FIG. 12. According to this embodiment, when the DAC has the same output range as a DAC in FIG. 12, the voltage difference (Vb−Va) between the two reference voltages is reduced be a reciprocal multiple of (1+Rf/R1) of the voltage difference (Vb−Va) in the example of the conventional art. When the resistor Rf is set to be equal to the resistor R1 and the supply voltage VSS is set to be equal to the GND voltage, for example, the voltage difference (Vb−Va) becomes a half of that in the configuration shown in FIG. 12. The maximum value Δ Vofc of the output error Vofc is therefore reduced to be approximately one quarter of the maximum value Δ Vofc in the configuration shown in FIG. 12.

The output voltage Vout in this embodiment becomes the one that has been amplified with respect to current to voltage conversion by the amplifier unit 110 by the constant voltage amplification factor. A voltage accuracy which is particularly higher than that achieved by the DAC shown in FIG. 12 can be implemented.

Also assume that the reference voltages other than adjacent reference voltages, inclusive of reference voltages that may be identical, are used from among the n reference voltages V1 to Vn and operated by the amplifying circuit 11, for output. In this case as well, since the entire reference voltage range is small, output of a highly accurate voltage is possible as in a case where the adjacent reference voltages are used. The number of the reference voltages can be greatly reduced without greatly increasing the number of differential pairs.

Further, since an input impedance of the amplifying circuit 11 is high, the reference voltage generation circuit 13 can be formed of a simple circuit such as the resistor string.

Figure 2:
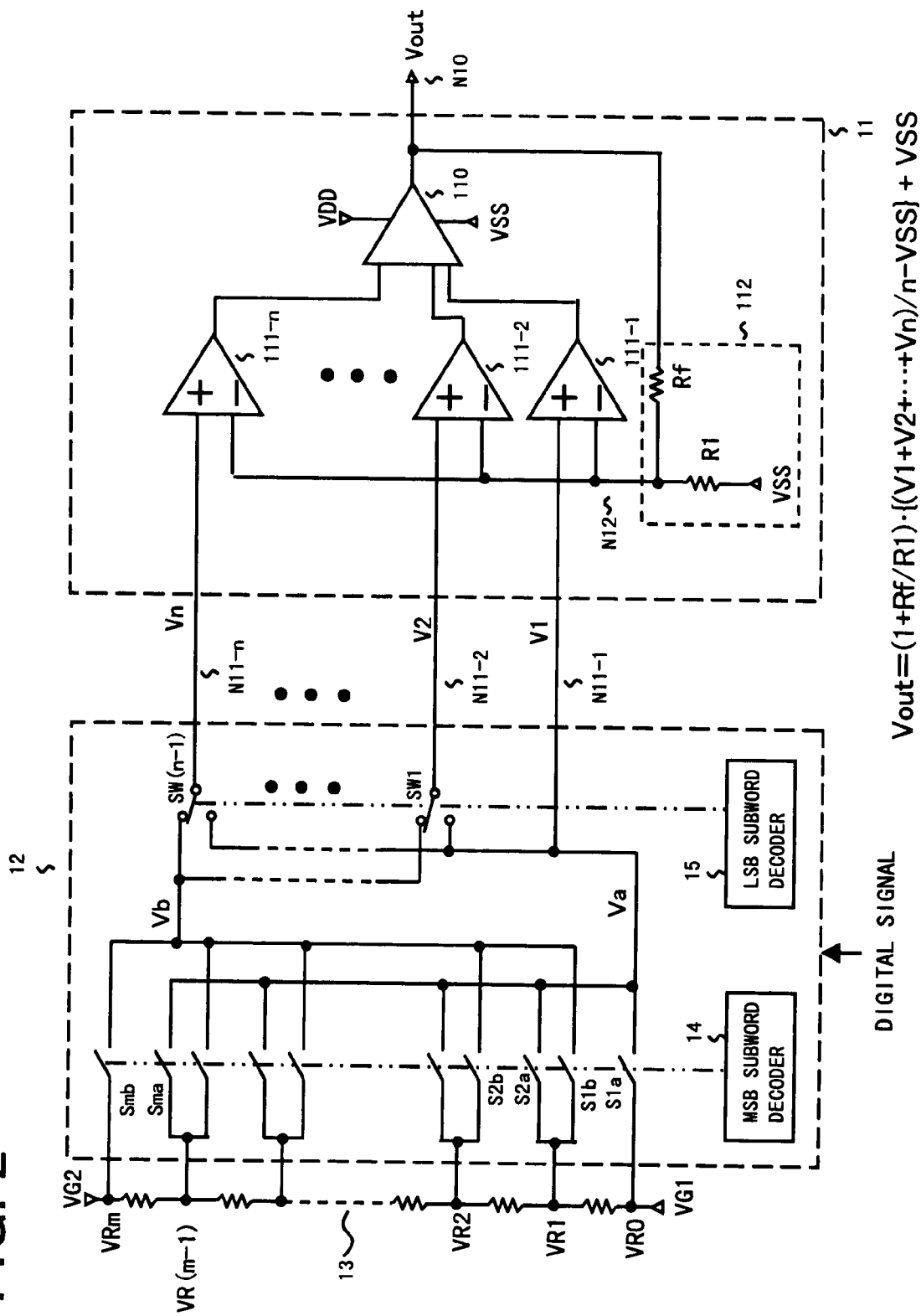
FIG. 2 is a diagram showing a configuration of the DAC in an embodiment of the present invention.
Figure 12:
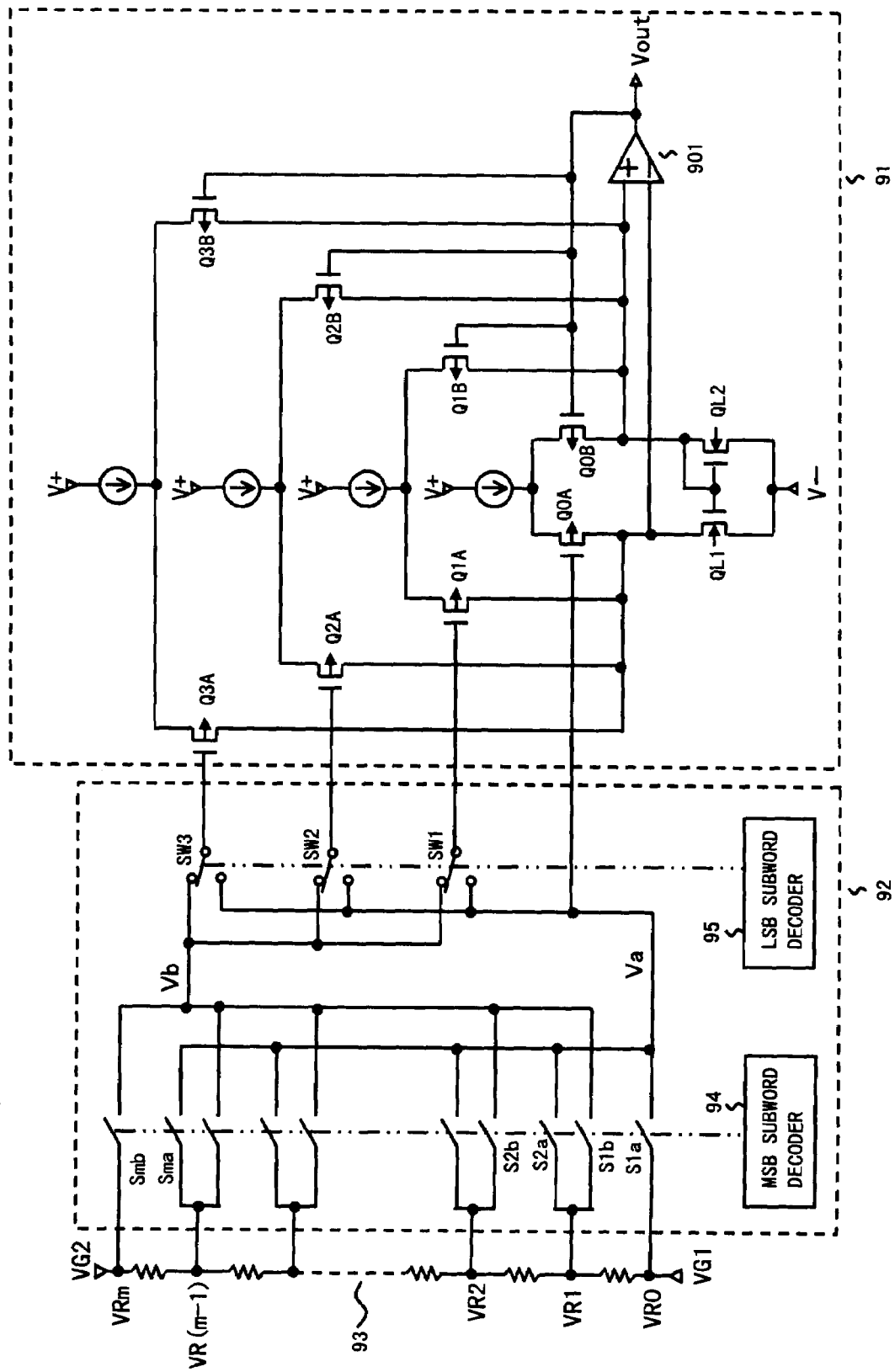
FIG. 12 is a diagram showing a DAC configuration disclosed in Patent Document 4.

FIG. 2 is a diagram showing a configuration of a digital-to-analog converter circuit (DAC) in a first example of the present invention. The DAC in the first example is the one which includes a decoder that selects two adjacent reference voltages as the reference voltages V1 to Vn to be input to the amplifying circuit 11. Referring to FIG. 2, a decoder 92 in the conventional DAC in FIG. 12 is employed as the decoder 12 in this DAC. The decoder 12 will be described below.

The decoder 12 in FIG. 2 is constituted from a first group, a second group, and a third group of switches. The first group of switches is constituted from m switches S1a to Sma. In each of the switches S1a to Sma, a first terminal is connected to a corresponding one of first to mth taps that outputs the m reference voltages VR0 to VR(m−1), respectively, and second terminals (output terminals) of the switches S1a to Sma are connected in common. One reference voltage Va is selected from among the m reference voltages VR0 to VR(m−1) for the second terminal of each of the m switches S1a to Sma, based on an output of an MSB subword decoder 14. The second group of switches is constituted from m switches S1b to Smb. In each of the switches S1b to Smb, a first terminal is connected to a corresponding one of second to (m+1)th taps that output m reference voltages VR1 to VRm of the resistor string 13, and second terminals (output terminals) of the switches S1b to Smb are connected in common. The second group of switches selects a reference voltage Vb at a level adjacent to a level of the reference voltage Va, based on the output of the MSB subword decoder 14. The third group of switches is constituted from (n−1) selector switches SW1, SW2, and SW(n−1), each of which selects one of the reference voltage Va at a connecting node of the second terminals of the first group of switches connected in common and the reference voltage Vb at a connecting node of the second terminals of the second group of switches connected in common, based on an output of an LSB subword decoder 15.

On/off control of the first group of switches S1a to Sma and the second group of switches S1b to Smb is performed by the output of the MSB subword decoder 14 based on higher-order bits of an input digital signal. The third group of switches are controlled by the output of the LSB subword decoder 15 based on lower-order bits of the input digital signal. The MSB subword decoder 14 and the LSB subword decoder 15 have the same configurations as an MSB subword decoder 94 and an LSB subword decoder 95 in FIG. 12, respectively.

The input terminals N11-1 of the amplifying circuit 11 is connected to an output node of the second terminals of the first group of switches S1a to Sma connected in common. The reference voltage Va is applied to the amplifying circuit as the reference voltage V1.

The input terminals N11-2, . . . , and N11-n of the amplifying circuit 11 are connected to output terminals of the selector switches SW1, SW2, . . . , and SW(n−1) of the third group of switches, respectively, and the selected reference voltages Va or Vb are applied to the amplifying circuit 11 as the reference voltages V2, . . . , and Vn, respectively. In FIG. 2, the input terminal N11-1 of the amplifying circuit 11 is connected to an output node of the first group of switches S1a to Sma connected in common. Meanwhile, a configuration in which the input terminal N11-1 is connected to an output node of the second group of switches S1b to Smb connected in common may be used. In that case, the reference voltage Vb is input to the amplifying circuit 11 as the voltage V1.

As in the configuration shown in FIG. 1, the amplifying circuit 11 in FIG. 2 is configured by including the n differential units (differential circuits) 111-1 to 111-n that receive the n reference voltages V1 to Vn at the first terminals (non-inverting input terminals) of the input pairs thereof, respectively, the amplifying unit 110 that adds the output currents of the differential units 111-1 to 111-n, thereby performing current to voltage conversion and amplification, and the amplification factor control unit 112. The amplification factor control unit 112 is connected between the output terminal N10 and the second terminals N12 (inverting input terminals) of the n differential units 111-1 to 111-n connected in common. The amplification factor control unit 112 controls a voltage amplification factor to be larger than 1. The amplification factor control unit 112 is formed of the resistor (feedback resistor) Rf connected between the terminals N12 and the output terminal N10 and the resistor R1 connected between the terminals N12 and the power supply VSS.

An operation of the DAC in this embodiment will be described below.

First, using an output of the MSB (Most Significant Bit) subword decoder 14 based on higher-order bit signals of input data, the kth switches (Ska and Skb) of the first and second groups of switches (S1a, . . . Sma) and (S1b, . . . Smb) are turned on, thereby selecting the reference voltages at the adjacent taps as the reference voltages Va and Vb. In this case, the reference voltage Va is output to the terminal N11-1. Then, by an output of the LSB (Least Significant Bit) subword decoder 15 based on lower-order bit signals of the input data, switching of the third group of switches (SW1, SW2, . . . , and SW(n−1)) is controlled. The reference voltage Va or Vb is output to each of the terminals N11-2 to N11-n.

In the DAC in FIG. 2, the reference voltage Va or Vb is selected as each of the n reference voltages V1 to Vn. When (n-L) reference voltages Va and L reference voltages Vb are selected as the reference voltages V1 to Vn (in which L is one of integers from zero to n−1), for example, the output voltage Vout of the amplifying circuit 11 is expressed by the following expression (2) obtained by inputting Va and Vb in expression (1):

$$Vout = (1 + Rf/R1) \times \{((n-L) \cdot Va + L \cdot Vb)/n - VSS\} + VSS \quad (2)$$
$$= (1 + Rf/R1) \times \{(Va + L \cdot (Vb - Va)/n) - VSS\} + VSS$$

According to expression (2), the output voltage Vout of the amplifying circuit 11 becomes a value obtained by multiplying a voltage difference between each of n level voltages and the supply voltage VSS by the voltage amplification factor (1+Rf/R1) and adding the supply voltage VSS to the multiplied voltage difference. The n level voltages are obtained by n division with respect to the reference voltages Va and Vb.

The DAC in FIG. 2 includes the n differential units 111-1 to 111-n. The number of the reference voltages generated by the resistor string 13 can be thereby reduced to 1/n of the number of output levels. Further, amplification by the voltage amplification factor larger than one is performed. Accordingly, each reference voltage can be lowered with respect to an output range.

With this arrangement, the device size of each transistor switch that constitutes the decoder 12 can be reduced. The number of wires can also be reduced. Area saving can be thereby implemented.

Further, a potential difference between the adjacent reference voltages is sufficiently small. Thus, output of a highly accurate voltage with a sufficiently small output error becomes possible.

Figure 3A:
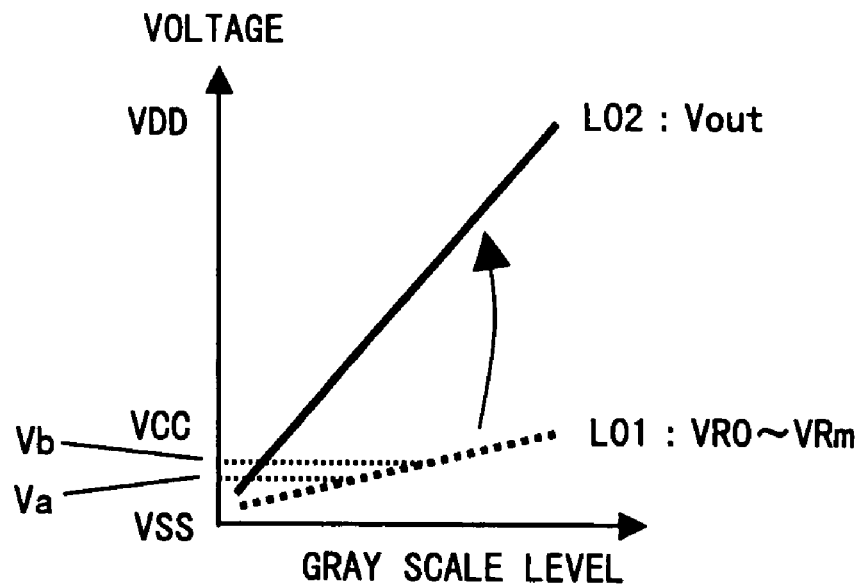
FIGS. 3A and 3B are graphs each showing input and output characteristics of the DAC in FIG. 1 or 2.
Figure 3B:
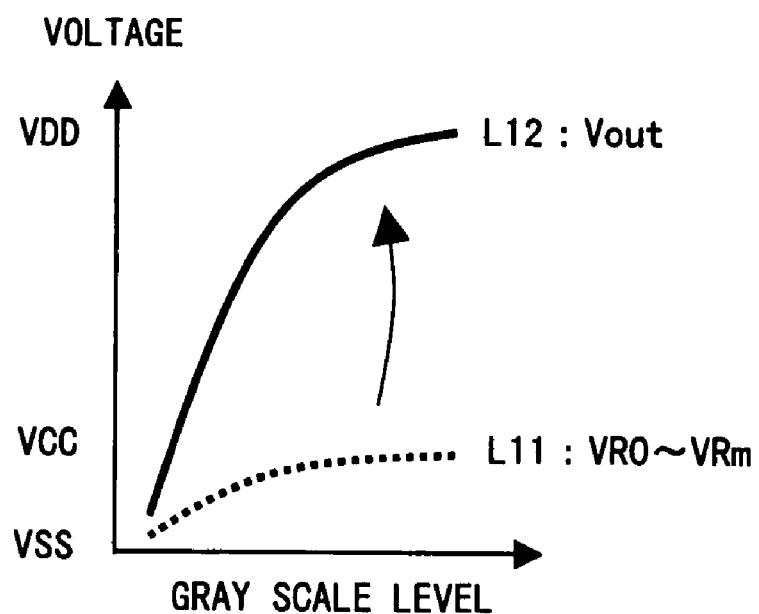

FIGS. 3A and 3B are graphs showing input and output characteristics of the DAC in FIGS. 1 and 2. FIG. 3A shows input and output characteristics of the linear DAC having a linear voltage characteristic with respect to an output level. FIG. 3B shows input and output characteristics of the DAC having a nonlinear voltage characteristic with respect to an output level.

FIG. 3A shows an input characteristic L01 of the reference voltages VR0 to VRm and an output characteristic L02 of the output voltage Vout. A horizontal axis indicates a gray scale level, while a vertical axis indicates a voltage. Since the number of the reference voltages is smaller than the number of output levels, the characteristic L01 is the characteristic of values corresponding to the output levels that are discrete. The voltage amplification factor from the characteristic L01 to the characteristic L02 is set by the amplification factor control unit 112. Specifically, the voltage amplification factor is set by a resistor ratio between the resistors R1 and Rf in FIGS. 1 and 2.

Assume that FIG. 3A and FIG. 15A (using the same scale) are compared. When both of the output characteristics (L02 and L90) are the same, an input range of the input characteristic L01 in FIG. 3A is sufficiently smaller than an input range in FIG. 15A. Accordingly, the decoder 12 that selects the reference voltages can be operated at a lower power supply voltage.

Further, a potential difference between the arbitrary adjacent reference voltages Va and Vb is sufficiently small. It can be therefore seen that output of a quite highly accurate voltage is made possible, against an output error characteristic in FIG. 15C, caused by an operation.

FIG. 3B likewise shows an input characteristic L11 of the reference voltages VR0 to VRm and an output characteristic L12 of the output voltage Vout. A horizontal axis indicates a level, while a vertical axis indicates a voltage. The voltage amplification factor from the characteristic L11 to the characteristic L12 is set by the amplification factor control unit 112. In the output characteristic L12, a nonlinear characteristic is implemented by aggregates of linear output segments having different gradients.

In the case of FIG. 3B as well, an input range of the input characteristic L11 is sufficiently small, as in FIG. 3A. Thus, the decoder 12 that selects the reference voltages can be operated at a lower supply voltage. Further, output of a quite highly accurate voltage is possible.

Figure 4:
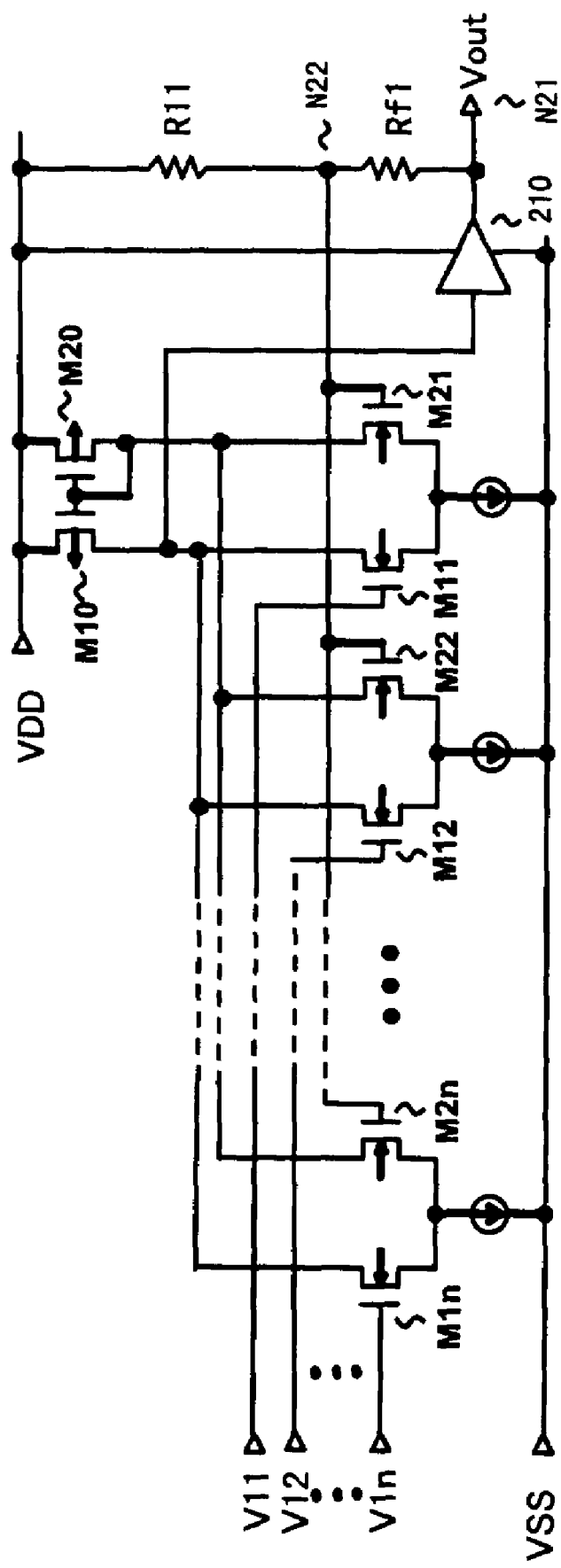
FIG. 4 is a diagram showing an example of a configuration of an amplifying circuit of the DAC in FIG. 1 or 2 in the embodiment.
Figure 5:
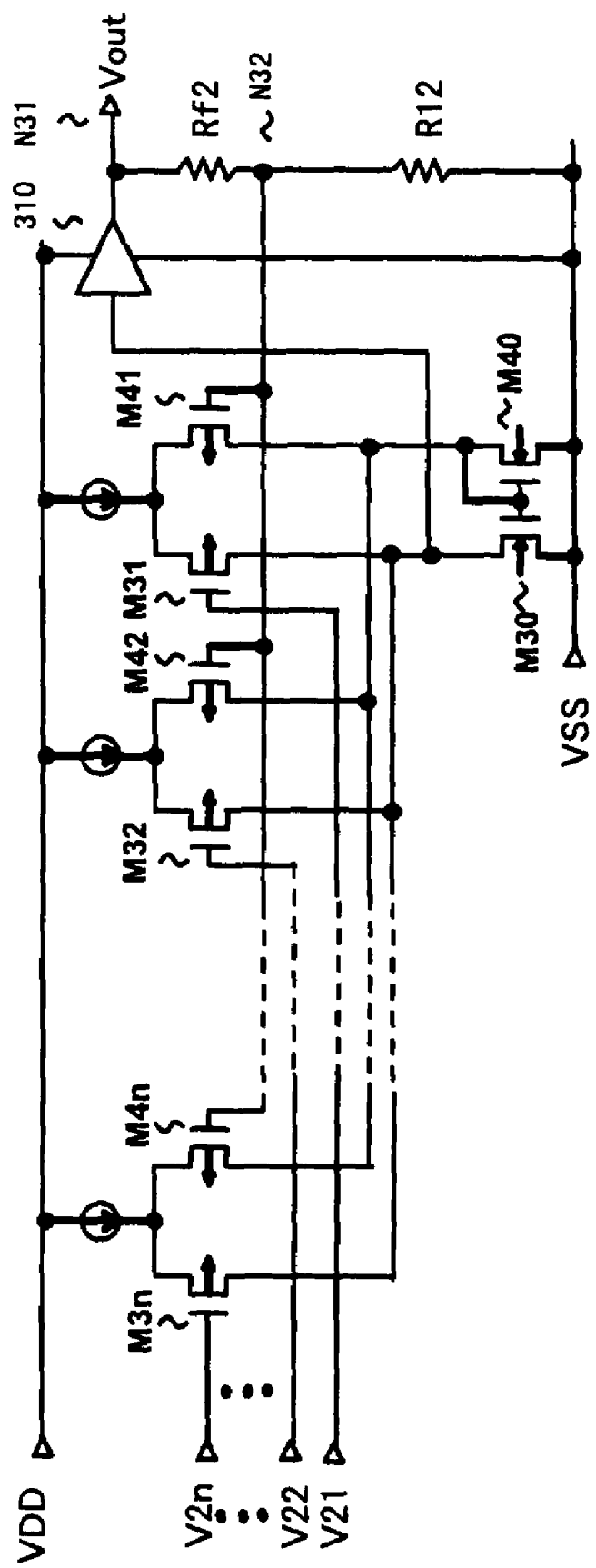
FIG. 5 is a diagram showing other example of the configuration of the amplifying circuit of the DAC in FIG. 1 or 2 in the embodiment.

FIGS. 4 and 5 are diagrams each showing a specific configuration of the amplifying circuit II of the DAC in FIGS. 1 and 2.

Referring to FIG. 4, this amplifying circuit includes first to nth differential pairs (M11, M21), (M12, M22), . . . , and (M1n, M2n), each of which is formed of a pair of Nch transistors having coupled sources connected to an associated current source with one terminal connected to a low potential side voltage supply VSS. First outputs of output pairs of the first to nth differential pairs are connected in common, and second outputs of the output pairs of the first to nth differential pairs are connected in common. Between the output pairs of the first to nth differential pairs connected in common and a high potential side voltage supply VDD, a current mirror (M10, M20) that constitutes a load circuit for the differential pairs is connected. An amplifying unit 210 is connected between an output terminal (a drain of the transistor M10) of the current mirror and an output terminal N21. Resistors R11 and Rf1 are connected in series between the output terminal N21 and the high potential side voltage supply VDD as the amplification factor control unit. Input voltages V11, V12, . . . , and V1n are input to first terminals (gates of the transistors M11, M12, . . . , and M1n) of input pairs of the first to nth differential pairs, respectively, and second terminals (gates of the transistors M21, M22, . . . , and M2n) of the input pairs of the first to nth differential pairs are connected in common to a connecting point N22 between the resistors R11 and Rf1.

The simplest configuration of the amplifying unit 210 may be formed of a charging transistor connected between the high potential side voltage supply VDD and the output terminal N21, with a gate thereof connected to the output terminal (drain of the transistor M10) of the current mirror and a discharging element connected between the low potential side voltage supply VSS and the output terminal N21.

A switch or the like is not connected to the resistors R11 and Rf1 of the amplification factor control unit, and the resistors R11 and Rf1 are fixedly connected.

The output voltage Vout of the amplifying circuit in FIG. 4 is expressed by the following expression:

$$Vout=(1+Rf1/R11)\times\{(V11+V12+\ldots+V1n)/n-VDD\}+VDD \quad (3)$$

According to Expression (3), the output voltage Vout becomes a value obtained by multiplying a voltage difference between an average value of n voltages V11 to V1n $\{(V11+V12+\ldots+V1n)/n\}$ and a high potential supply voltage VDD by the amplification factor (1+Rf1/R11) and further adding the supply voltage VDD to the multiplied voltage difference.

In this configuration, the input range becomes closer to the high potential side voltage supply VDD than the output range of the output voltage Vout. The amplifying circuit in FIG. 4 thus can be employed as a positive-polarity amplifier for dot inversion driving. The amplifying unit 210 in FIG. 4 may be formed of a differential amplifier with a differential input pair thereof connected to the drain of the transistor M10 and a drain of the transistor M20. In this case, an inverting input terminal of the differential amplifier 210 is connected to the output terminal (drain of the transistor M10) of the current mirror and a non-inverting input terminal of the differential amplifier 210 is connected to an input terminal (drain of the transistor M20) of the current mirror.

In FIG. 5, the differential pairs in FIG. 4 are each formed of Pch transistors. That is, this amplifying circuit includes first thorough nth differential pairs (M31, M41), (M32, M42), . . . , and (M3n, M4n), each of which is formed of a pair of Pch transistors having coupled sources connected to an associated current source with one terminal connected to the high potential side voltage supply VDD. First outputs of output pairs of the first to nth differential pairs are connected in common, and second outputs of the output pairs of the first to nth differential pairs are connected in common. Between the respective output pairs of the first to nth differential pairs connected in common and the low potential side voltage supply VSS, a current mirror (M30, M40) that constitutes a load circuit for the differential pairs is connected. An amplifying unit 310 is connected between an output terminal (a drain of the transistor M30) of the current mirror and an output terminal N31. Resistors R12 and Rf2 are connected in series between the output terminal N31 and the low potential side voltage supply VSS as an amplification factor control unit. Input voltages V21, V22, ..., and V2n are input to first terminals (gates of the transistors M31, M32, and M3n) of input pairs of the differential pairs, respectively, and second terminals (gates of the transistors M41, M42, ..., and M4n) of the input pairs of the differential pairs are connected in common to a connecting point N32 between the resistor R12 and Rf2. The simplest configuration of the amplifying unit 310 may be formed of a discharging transistor connected between the low potential side voltage supply VSS and the output terminal N31, with a gate thereof connected to an output terminal (drain of the transistor M30) of the current mirror and a charging element connected between the high potential side voltage supply VDD and the output terminal N31. A switch or the like is not connected to the resistors R12 and Rf2 of the amplification factor control unit, and the resistors R12 and Rf2 fixedly connected.

The output voltage Vout of the amplifying circuit in FIG. 5 is expressed by the following expression:

$$Vout=(1+Rf2/R12)\times\{(V21+V22+\ldots+V2n)/n-VSS\}+VSS \quad (4)$$

According to Expression (4), the output voltage Vout becomes a value obtained by multiplying a voltage difference between an average value of the n voltages V21 to V2n $\{(V21+V22+\ldots+V2n)/n\}$ and the low potential side voltage supply VSS by an amplification factor $(1+Rf2/R12)$ and further adding the supply voltage VSS to the multiplied voltage difference.

In this configuration, the input range is set to the low potential side voltage supply VSS for the output range of the output voltage Vout. The amplifying circuit in FIG. 5 thus can be employed as a negative-polarity amplifier for a data driver for dot inversion driving. The amplifying unit 310 in FIG. 5 may be formed of a differential amplifier with a differential input pair thereof connected to the drain of the transistor M30 and a drain of the transistor M40. In this case, an inverting input terminal of the differential amplifier 310 is connected to the output terminal (drain of the transistor M30) of the current mirror and a non-inverting input terminal of the differential amplifier 310 is connected to an input terminal (drain of the transistor M40) of the current mirror.

Figure 6:
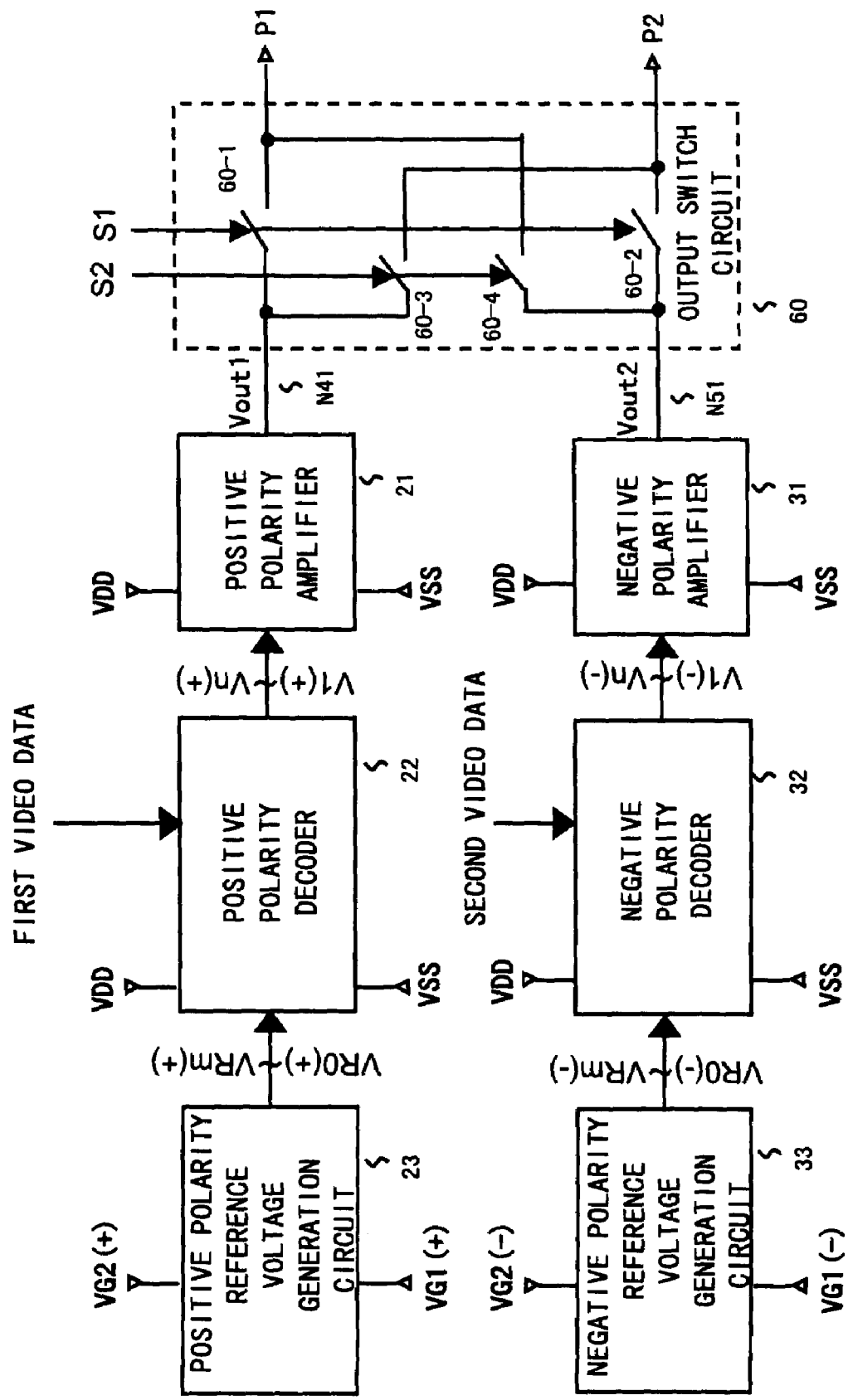
FIG. 6 is a diagram showing an example of a configuration example of an embodiment in which the DAC in FIG. 1 or 2 is applied to a data driver for driving a liquid crystal.

FIG. 6 is a diagram showing an embodiment in which the DAC in FIG. 1 or 2 is applied to a data driver for driving a liquid crystal.

FIG. 6 is the diagram showing DAC configurations for two outputs in the data driver that performs dot inversion driving. In the dot inversion driving, polarities of voltages of adjacent data lines (962) on a display panel 960 in FIG. 11 become positive-polarity and negative-polarity with respect to an opposing substrate electrode voltage VCOM.

In FIG. 6, two adjacent data lines are connected to driver output terminals P1 and P2 in FIG. 6.

Referring to FIG. 6, voltages VG1(+) and VG2(+) are input to a positive-polarity reference voltage generation circuit 23. The positive-polarity reference voltage generation circuit 23 outputs (m+1) reference voltages VR0(+) to VRm(+).

A positive-polarity decoder 22 selects n voltages from among the (m+1) reference voltages VR0(+) to VRm(+) inclusive of reference voltages that may be identical according to input first video digital data, and outputs the selected voltages as positive-polarity reference voltages V1(+) to Vn(+).

A positive-polarity amplifier 21 performs amplification and outputs a positive-polarity gray scale voltage Vout1 to an amplifier output terminal N41 based on the n positive-polarity reference voltages V1(+) to Vn(+).

Voltages VG1(-) and VG2(-) are input to a negative-polarity reference voltage generation circuit 33. The negative-polarity reference voltage generation circuit 33 outputs (m+1) reference voltages VR0(-) to VRm(-).

A negative-polarity decoder 32 selects n voltages from among the (m+1) reference voltages VR0(-) to VRm(-) inclusive of reference voltages that may be identical according to input second video digital data, and outputs the selected voltages as negative-polarity reference voltages V1(-) to Vn(-). A negative-polarity amplifier 31 performs amplification and outputs a negative-polarity gray scale voltage Vout2 to an amplifier output terminal N51 based on the n negative-polarity reference voltages V1(-) to Vn(-).

An output switch circuit 60 includes switches 60-1 and 60-2 controlled by a signal S1 and switches 60-3 and 60-4 controlled by a control signal S2. When the switches 60-1 and 60-2 controlled by the control signal S1 are turned on, the amplifier output terminal N41 is connected to the driver output terminal P1, and the amplifier output terminal N51 is connected to the driver output terminal P2. Then, the output voltage Vout1 of the positive-polarity amplifier 21 and the output voltage Vout2 of the negative-polarity amplifier 31 are outputted to the driver output terminals P1 and P2, respectively. When the switches 60-3 and 60-4 controlled by the control signal S2 are turned on, the amplifier output terminal N41 is connected to the driver output terminal P2, and the amplifier output terminal N51 is connected to the driver output terminal P1. Then, the output voltage Vout1 of the positive-polarity amplifier 21 and the output voltage Vout2 of the negative-polarity amplifier 31 are outputted to the driver output terminals P2 and P1, respectively.

Figure 7A:
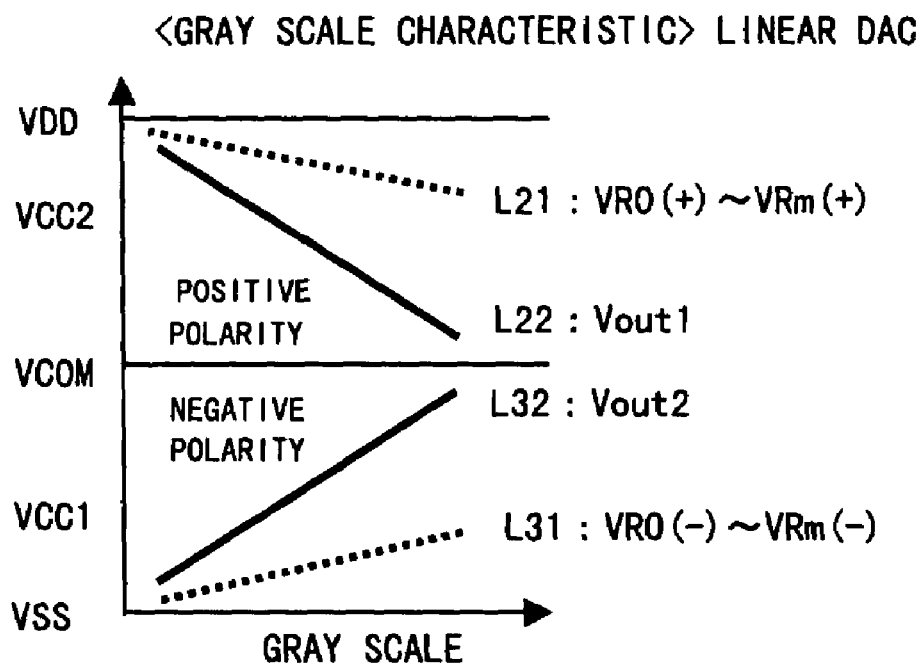
FIGS. 7A and 7B are graphs each showing input and output characteristics of the data driver in FIG. 6.
Figure 7B:
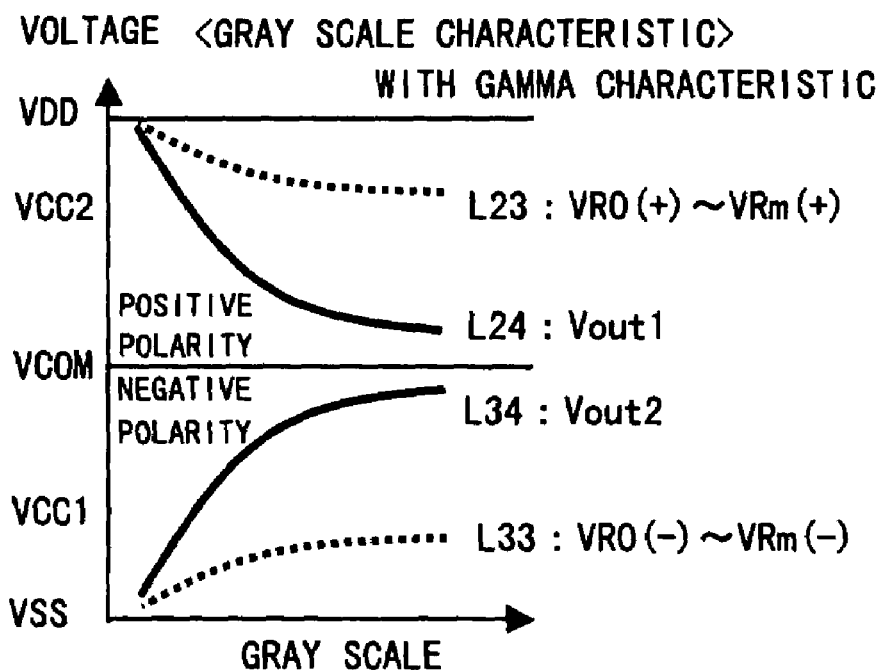

FIGS. 7A and 7B are graphs showing input and output characteristics of the data driver in FIG. 6. FIG. 7A shows the input and output characteristics of the linear DAC having a linear voltage characteristic with respect to a gray scale level, while FIG. 7B shows the input and output characteristics of the DAC having a nonlinear voltage characteristic due to a gamma characteristic of a liquid crystal with respect to a gray scale level.

FIG. 7A shows an input characteristic L21 of the positive-polarity reference voltages VR0(+) to VRm(+), an output characteristic L22 of the output voltage Vout1 of the positive-polarity amplifier 21, an input characteristic L31 of the negative-polarity reference voltages VR0(-) to VRm(-), and an output characteristic L32 of the output voltage Vout2 of the negative-polarity amplifier 31. Since the number of the reference voltages is smaller than the number of gray scales, the characteristics L21 and L31 are the characteristics of values corresponding to the discrete gray scales.

A voltage amplification factor from the characteristic L21 to the characteristic L22 and a voltage amplification factor from the characteristic L31 to the characteristic L32 are set by the amplification factor control units of the positive-polarity amplifier 21 and the negative-polarity amplifier 31, respectively.

Likewise, FIG. 7B shows an input characteristic L23 of the positive-polarity reference voltages VR0(+) to VRm(+), an output characteristic L24 of the output voltage Vout1 of the positive-polarity amplifier 21, an input characteristic L33 of the negative-polarity reference voltages VR0(-) to VRm(-), and an output characteristic L34 of the output voltage Vout2 of the negative-polarity amplifier 31. Each of the output characteristics L24 and L34 implements a nonlinear characteristic due to aggregates of linear output segments having different gradients.

As the positive-polarity amplifier 21 and the negative-polarity amplifier 31 in FIG. 6, the amplifying circuits in FIGS. 4 and 5 may be employed, respectively. The positive-polarity amplifier 21 can be configured by replacing the n input voltages V11 to V1n and the output voltage Vout in the amplifying circuit in FIG. 4 by the positive-polarity reference voltages V1(+) to Vn(+) and the positive-polarity gray scale voltage Vout1, respectively. The negative-polarity amplifier 31 can be configured by replacing the n input voltages V21 to V2n and the output voltage Vout in the amplifying circuit in FIG. 5 by the negative-polarity reference voltages V1(−) to Vn(−) and the negative-polarity gray scale voltage Vout2, respectively.

An input range of the positive-polarity amplifier 21 becomes a narrower range (VCC2 to VDD) closer to the high potential side voltage supply VDD than an output range (VCOM to VDD). An input range of the negative-polarity amplifier 31 becomes a narrower range (VSS to VCC1) closer to the low potential side voltage supply VSS than an output range (VSS to VCOM). Since the input range is smaller than the output range, only the differential pairs of one polarity of the differential units of each of the positive-polarity amplifier 21 and the negative-polarity amplifier 31 can drive each output range.

Alternatively, there may be prepared a voltage supply VCOM. Then, in the positive-polarity amplifier 21, the voltage supply VSS in the amplifying circuit in FIG. 4 may be replaced by the voltage supply VCOM. In the negative-polarity amplifier 31, the voltage supply VDD in FIG. 5 may be replaced by the voltage supply VCOM.

Alternatively, the voltages VCC1 and VCC2 may be supplied as supply voltages. In that case, each of the positive-polarity decoder 22 and the negative-polarity decoder 32 can be formed of small-sized low voltage devices.

Next, power consumption of the DAC in this embodiment shown in FIG. 6 will be described.

Figure 13A:
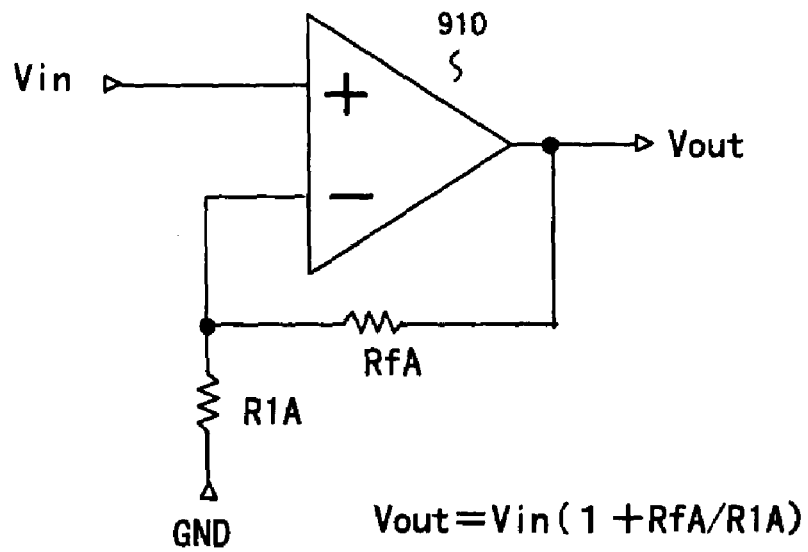
FIGS. 13A and 13B are respectively a diagram showing a configuration of an amplifying circuit and input and output characteristics of the amplifying circuit, disclosed in Patent Document 6.
Figure 13B:
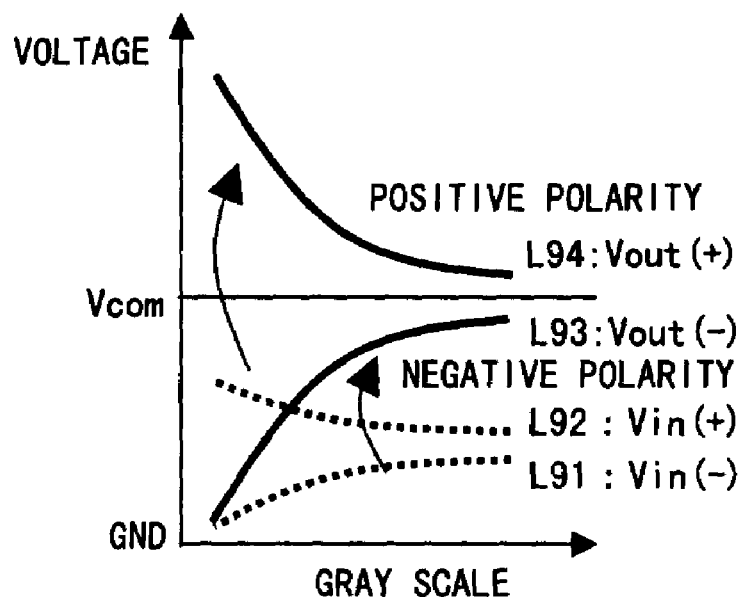
Figure 14A:
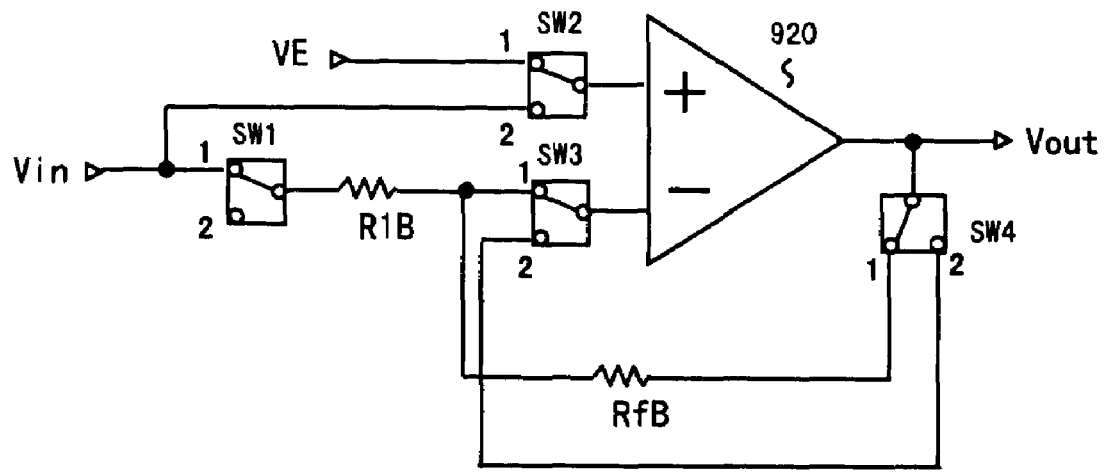
FIGS. 14A and 14B are respectively a diagram showing a configuration of an amplifying circuit and input and output characteristics of the amplifying circuit, disclosed in Patent Document 6.
Figure 14B:
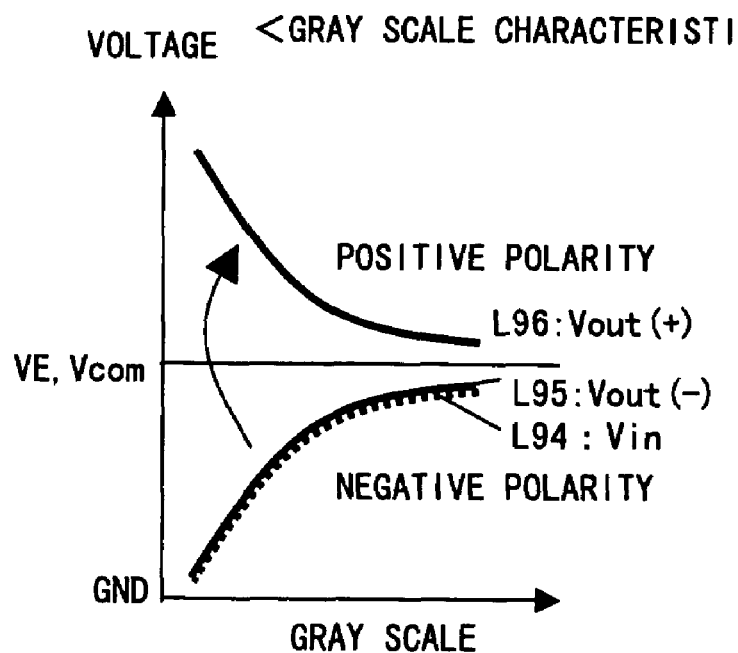

In configurations of amplifying circuits in FIGS. 13A and 14A, current flows through resistors RfA and R1A between an output terminal and the GND, and current flows through resistors RfB and R1B. The current is proportional to a voltage difference between the output terminal and the GND. Accordingly, power consumption at the resistors that set a voltage amplification factor is proportional to a square of the voltage difference between the output terminal and the GND. The voltage difference between the output terminal and the GND in each of the amplifying circuits in FIGS. 13A and 14A when a positive-polarity gray scale voltage is output is larger than the maximum value of a liquid crystal application voltage (which is a potential difference between the gray scale voltage and an opposing substrate electrode voltage). There is therefore a problem that power consumption of the entire amplifying circuit including the resistors that set the voltage amplification factor is large.

On contrast therewith, in the DAC configuration in FIG. 6, the two resistors Rf1 and R11 are provided in series between the output terminal N21 (indicated by reference numeral N41 in FIG. 6) and the high potential side voltage supply VDD in the amplification factor control unit (Rf1, R11) of the amplifying circuit in FIG. 4 constituting the positive-polarity amplifier 21. Then, the two resistors Rf2 and R12 are provided in series between the output terminal N31 (indicated by reference numeral N51 in FIG. 6) and the low potential side voltage supply VSS in the amplification factor control unit (Rf2, R12) of the amplifying circuit in FIG. 5 that constitutes the negative-polarity amplifier 31.

In the DACs in FIG. 6 as well, current flows through the resistors Rf1 and R11 between the output terminal N21 (indicated by reference numeral N41 of FIG. 6) and the high potential side voltage supply VDD in the amplifying circuit in FIG. 4, and current flows through the resistors Rf2 and R12 between the output terminal N31 (indicated by reference numeral N51 of FIG. 6) and the low potential side voltage supply VSS in the amplifying circuit in FIG. 5. Then, power consumption at the amplification factor control unit (Rf1, R11) is proportional to a square of a voltage difference between the output terminal N21 and the voltage supply VDD. Power consumption at the amplification factor control unit (Rf2, R12) is proportional to a square of a voltage difference between the output terminal (N31) and the voltage supply (VSS). However, in each of the DACs in FIG. 6, the voltage difference between the output terminal (N21) and the voltage supply (VDD) and the voltage difference between the output terminal (N31) and the voltage supply (VSS) are always smaller than the maximum value of a liquid crystal application voltage. Accordingly, power consumption of each amplifying circuit in FIG. 6 is made to be lower than that of each of the amplifying circuits in FIGS. 13A and 14A.

Figure 8:
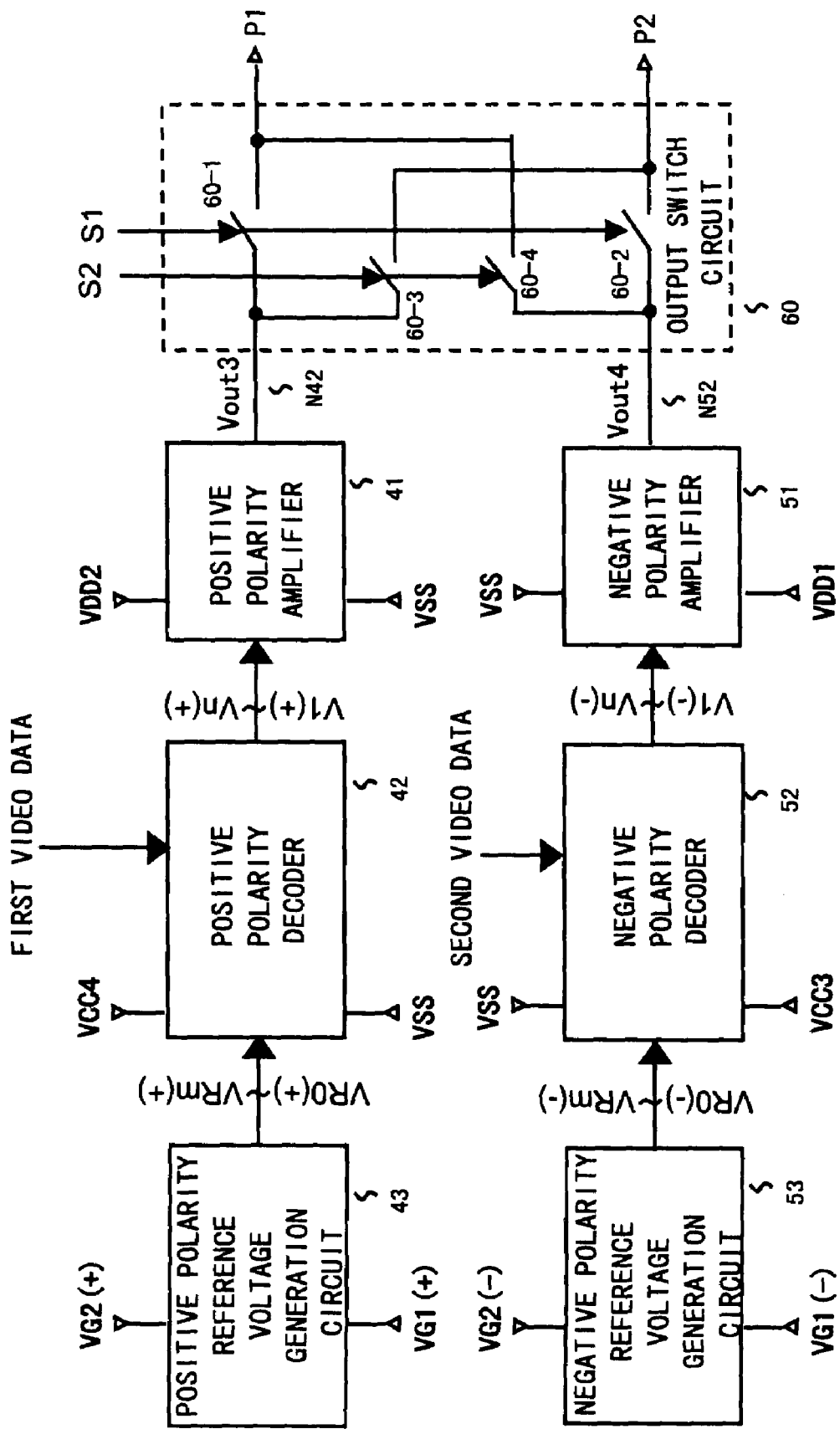
FIG. 8 is a diagram showing other configuration example of the embodiment in which the DAC in FIG. 1 or 2 is applied to the data driver for driving the liquid crystal.

FIG. 8 is a diagram showing other configuration of the embodiment in which the DAC in FIG. 1 or 2 is applied to the data driver for driving the liquid crystal. FIG. 8 is a diagram showing DAC configurations for two outputs in the data driver that performs dot inversion driving.

Referring to FIG. 8, the voltages VG1(+) and VG2(+) are input to a positive-polarity reference voltage generation circuit 43. The positive-polarity reference voltage generation circuit 43 outputs (m+1) reference voltages VR0(+) to VRm(+).

A positive-polarity decoder 42 selects n voltages from among the (m+1) reference voltages VR0(+) to VRm(+) inclusive of reference voltages that may be identical according to input first video digital data, and outputs the selected voltages as positive-polarity reference voltages V1(+) to Vn(+).

A positive-polarity amplifier 41 performs amplification and outputs a positive-polarity gray scale voltage Vout3 to an amplifier output terminal N42 based on the n positive-polarity reference voltages V1(+) to Vn(+).

The voltages VG1(−) and VG2(−) are input to a negative-polarity reference voltage generation circuit 53. The negative-polarity reference voltage generation circuit 53 outputs (m+1) reference voltages VR0(−) to VRm(−).

A negative-polarity decoder 52 selects n voltages from among the (m+1) reference voltages VR0(−) to VRm(−) inclusive of reference voltages that may be identical according to input second video digital data, and outputs the selected voltages as negative-polarity reference voltages V1(−) to Vn(−).

A negative-polarity amplifier 51 performs amplification and outputs a negative-polarity gray scale voltage Vout4 to an amplifier output terminal N52 based on the n negative-polarity reference voltages V1(−) to Vn(−).

The output switch circuit 60 has the same configuration as that in FIG. 6, and using the control signals S1 and S2, the output switch circuit 60 switches the output voltage Vout3 of the positive-polarity amplifier 41 and the output voltage Vout4 of the negative-polarity amplifier 51, for output to the driver output terminals P1 and P2.

Figure 9A:
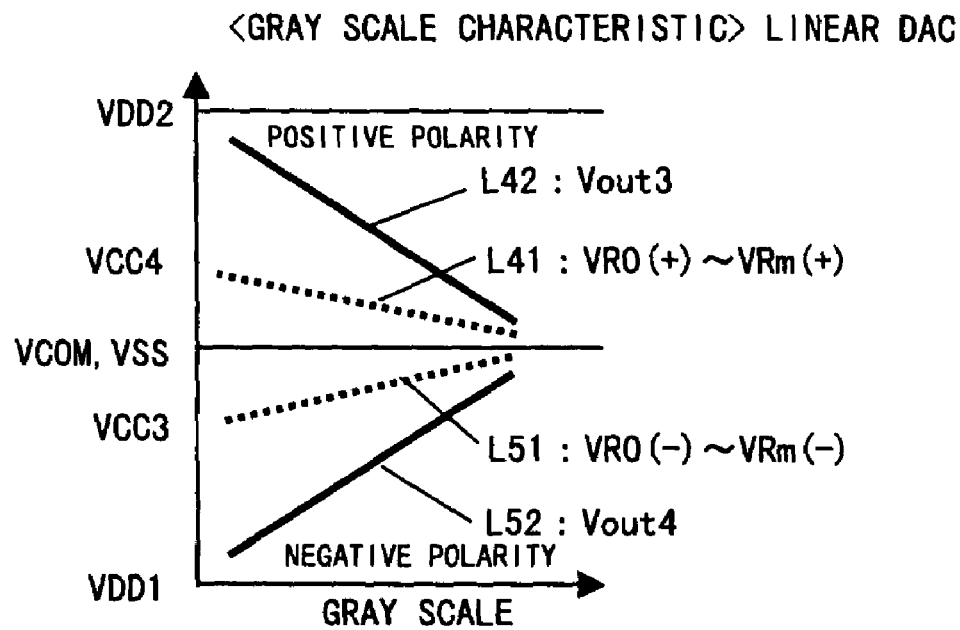
FIGS. 9A and 9B are graphs each showing input and output characteristics of the data driver in FIG. 8.
Figure 9B:
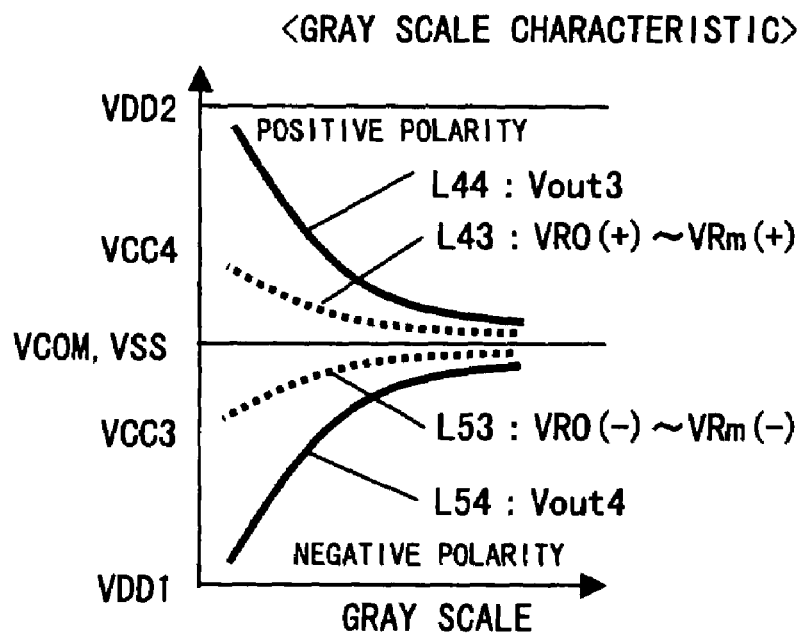

FIGS. 9A and 9B are graphs showing input and output characteristics of the data driver in FIG. 8. FIG. 9A shows the input and output characteristics of the linear DAC having a linear voltage characteristic with respect to a gray scale level, while FIG. 9B shows the input and output characteristics of the DAC having a nonlinear voltage characteristic due to a gamma characteristic of the liquid crystal with respect to a gray scale level.

FIG. 9A shows an input characteristic L41 of the positive-polarity reference voltages VR0(+) to VRm(+), an output characteristic L42 of the output voltage Vout3 of the positive-polarity amplifier 41, an input characteristic L51 of the negative-polarity reference voltages VR0(−) to VRm(−), and an output characteristic L52 of the output voltage Vout4 of the negative-polarity amplifier 51. Since the number of the reference voltages is smaller than the number of gray scales, the characteristics L41 and L51 are the characteristics of values corresponding to the discrete gray scales.

A voltage amplification factor from the characteristic L41 to the characteristic L42 and a voltage amplification factor from the characteristic L51 to the characteristic L52 are set by an amplification factor control unit of the positive-polarity amplifier 41 and an amplification factor control unit of the negative-polarity amplifier 51, respectively.

FIG. 9B shows an input characteristic L43 of the positive-polarity reference voltages VR0(+) to VRm(+), an output characteristic L44 of the output voltage Vout3 of the positive-polarity amplifier 41, an input characteristic L53 of the negative-polarity reference voltages VR0(−) to VRm(−), and an output characteristic L54 of the output voltage Vout4 of the negative-polarity amplifier 51. Each of the output characteristics L44 and L54 implements a nonlinear characteristic due to aggregates of linear output segments having different gradients.

In the configuration in FIG. 8, the reference voltage supply VSS in the vicinity of the voltage VCOM is prepared. To the positive-polarity amplifier 41, the reference voltage supply VSS and a high potential side voltage supply VDD2 having a higher potential than the reference voltage supply VSS are supplied. To the negative-polarity amplifier 51, the reference voltage supply VSS and a low potential side voltage supply VDD1 having a lower potential than the reference voltage supply VSS are supplied.

In this case, as the positive-polarity amplifier 41 and the negative-polarity amplifier 51, the amplifying circuit in FIG. 5 and the amplifying circuit in FIG. 4 can be employed, respectively. In the positive-polarity amplifier 41, the input voltages V21 to V2n and the output voltage Vout in the amplifying circuit in FIG. 5 are replaced by the positive-polarity reference voltages V1(+) to Vn(+) and the positive-polarity gray scale voltage Vout3, respectively, and the voltage supplies VDD and VSS in FIG. 5 are replaced by a high potential side voltage supply VDD2 and a reference voltage supply VSS, respectively. In the negative-polarity amplifier 51, the input voltages V11 to V1n and the output voltage Vout in the amplifying circuit in FIG. 4 are replaced by the negative-polarity reference voltages V1(−) to Vn(−) and the negative-polarity gray scale voltage Vout4, respectively, and the voltage supplies VDD and VSS in FIG. 4 are replaced by the reference voltage supply VSS and a low potential side voltage supply VDD1, respectively.

An input range of the positive-polarity amplifier 41 becomes a narrower range (VSS to VCC4) close to the reference voltage supply VSS than an output range (VSS to VDD2) of the positive-polarity amplifier 41. An input range of the negative-polarity amplifier 51 becomes a narrower range (VCC3 to VSS) closer to the reference voltage supply VSS than an output range (VDD1 to VSS) of the negative-polarity amplifier 51.

Only the differential pairs of one polarity of the differential units of each of the positive-polarity amplifier 41 and the negative-polarity amplifier 51 can drive each output range.

Alternatively, the voltages VCC3 and VCC4 may be supplied as supply voltages. In that case, each of the positive-polarity decoder 42 and the negative-polarity decoder 52 can be formed of small-sized low voltage devices. When the reference voltage supply VSS is set to the GND, for example, a voltage supply VCC4 can be shared with a low voltage supply for a logic circuit that performs digital processing on video data within the data driver.

Next, power consumption of the DACs in FIG. 8 will be described. In the DAC configurations in FIG. 8, in the amplification factor control unit in the positive-polarity amplifier 41, the two resistors (Rf2 and R12) are provided between the output terminal and the reference voltage supply VSS. In the amplification factor control unit in the negative-polarity amplifier 51, the two resistors (Rf1 and R11) are provided between the output terminal and the reference voltage supply VSS. In the DACs in FIG. 8 as well, current flows through the resistors that constitute each of the amplification factor control units. Then, power consumption at each of the amplification factor control units is proportional to a square of a voltage difference between each output terminal and the reference voltage supply VSS. However, in the DACs in FIG. 8 as well, the voltage difference between each output terminal and the reference voltage supply VSS in each of the positive-polarity amplifier 41 and the negative-polarity amplifier 51 is always smaller than the maximum value of a liquid crystal application voltage, as in the DACs in FIG. 6. Accordingly, power consumption of each amplifying circuit in FIG. 8 is made to be lower than that of each of the amplifying circuits in FIGS. 13A and 14A.

Figure 10:
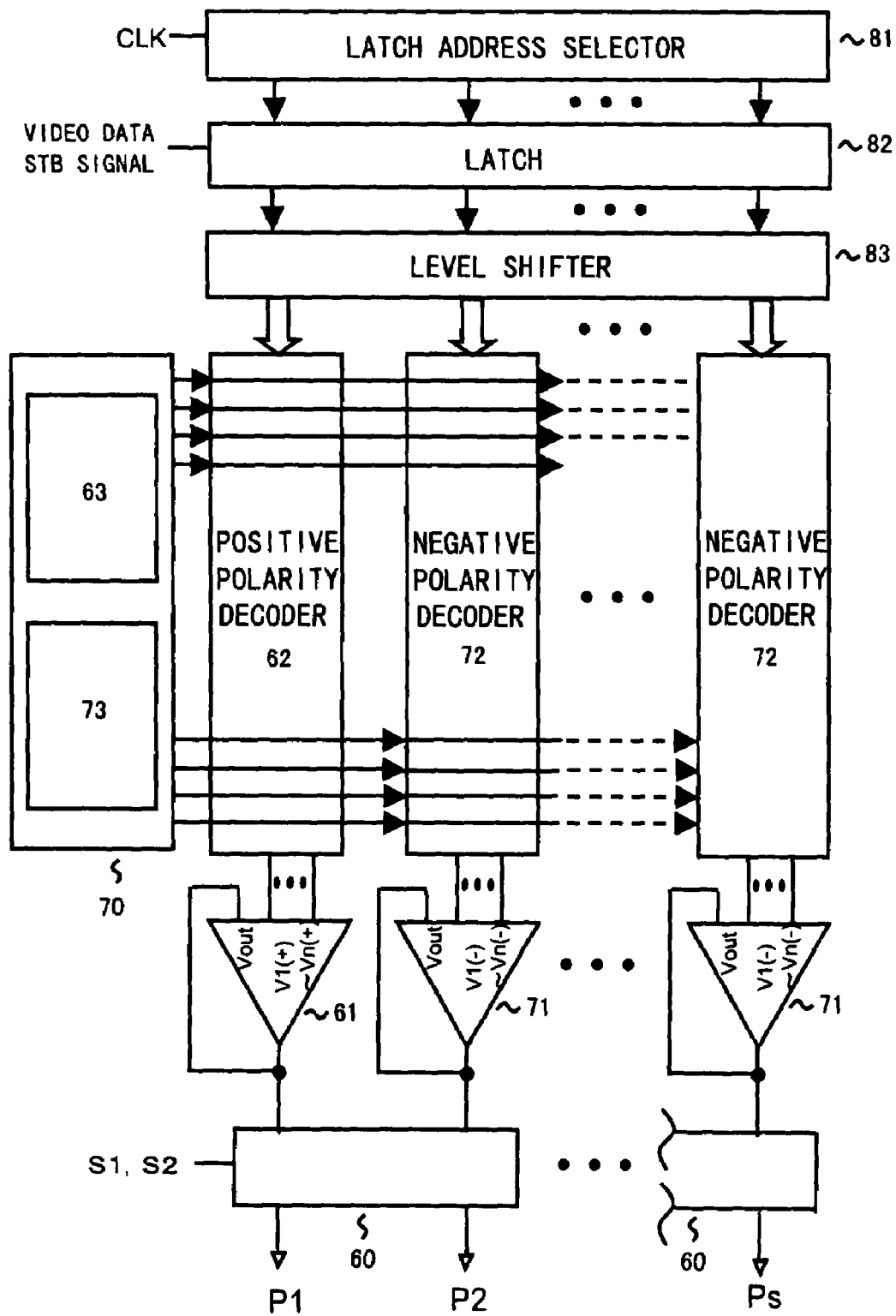
FIG. 10 is a diagram showing a configuration of a data driver for dot inversion driving including the DACs in FIG. 6 or 8.

FIG. 10 is a diagram showing the configuration of a data driver for dot inversion driving, including the DACs in FIG. 6 or FIG. 8. In FIG. 10, a main portion of the data driver is shown in the form of blocks.

Referring to FIG. 10, this data driver includes a latch address selector 81, a latch 82, a level shifter 83, a reference voltage generation circuit 70, positive-polarity decoders 62 and negative-polarity decoders 72, positive-polarity amplifiers 61 and negative-polarity amplifiers 71, and output switch circuits 60.

The latch address selector 81 determines a data latch timing based on a clock signal CLK.

The latch 82 latches video digital data based on the timing determined by the latch address selector 81, and outputs the data to the decoders 62 and 72 via the level shifter 83 in unison, in response to an STB (a strobe signal) signal.

Each of the latch address selector 81 and the latch 82 is a logic circuit and is generally constructed with a low supply voltage (of 0V to 3.3V).

The reference voltage generation circuit 70 includes a positive-polarity reference voltage generation circuit 63 and a negative-polarity reference voltage generation circuit 73.

To each of the positive-polarity decoders 62, reference voltages of the positive-polarity reference voltage generation circuit 63 are supplied. The positive-polarity decoder 62 selects the reference voltages corresponding to the input data, and outputs the n positive-polarity reference voltages V1(+) to Vn(+).

To each of the negative-polarity decoders 72, reference voltages of the negative-polarity reference voltage generation circuit 73 are supplied. The negative-polarity decoder 72 selects the reference voltages corresponding to the input data, and outputs the n negative-polarity reference voltages V1(−) to Vn(−).

Each positive-polarity amplifier 61 receives the n reference voltages output from the corresponding positive-polarity decoder 62, performs operational amplification of the n reference voltages, and supplies an output voltage to a corresponding one of the output switch circuits 60. Each negative-polarity amplifier 71 receives the n reference voltages output from the corresponding negative-polarity decoder 72, performs operational amplification of the n reference voltages, and supplies an output voltage to a corresponding one of the output switch circuits 60.

The output switch circuits 60 are provided for every two of the even number of driver output terminals P1, P2, . . . , and Ps, and the output voltages of each positive-polarity amplifier 61 and each negative-polarity amplifier 71 are switched, for output to the every two of the driver output terminals, in response to the control signal S1 or S2.

The data driver in FIG. 10 includes features and effects described with reference to FIGS. 1 to 9. When input of multi-bit data is performed, the number of reference voltages can be greatly reduced, compared with the number of gray scales. Accordingly, area saving of the positive-polarity decoder 62 and the negative-polarity decoder 72 can be achieved.

Further, each of the positive-polarity decoder 62 and the negative-polarity decoder 72 can be formed of a low voltage circuit. Thus, when each of the positive-polarity decoder 62 and the negative-polarity decoder 72 is constituted from low voltage devices, the area of each of the positive-polarity decoder 62 and the negative-polarity decoder 72 can be further reduced. For this reason, the data driver can be implemented at low cost.

Further, the data driver in FIG. 10 can accommodate both of a linear DAC and a DAC corresponding to the gamma characteristic of the liquid crystal.

Figure 11:
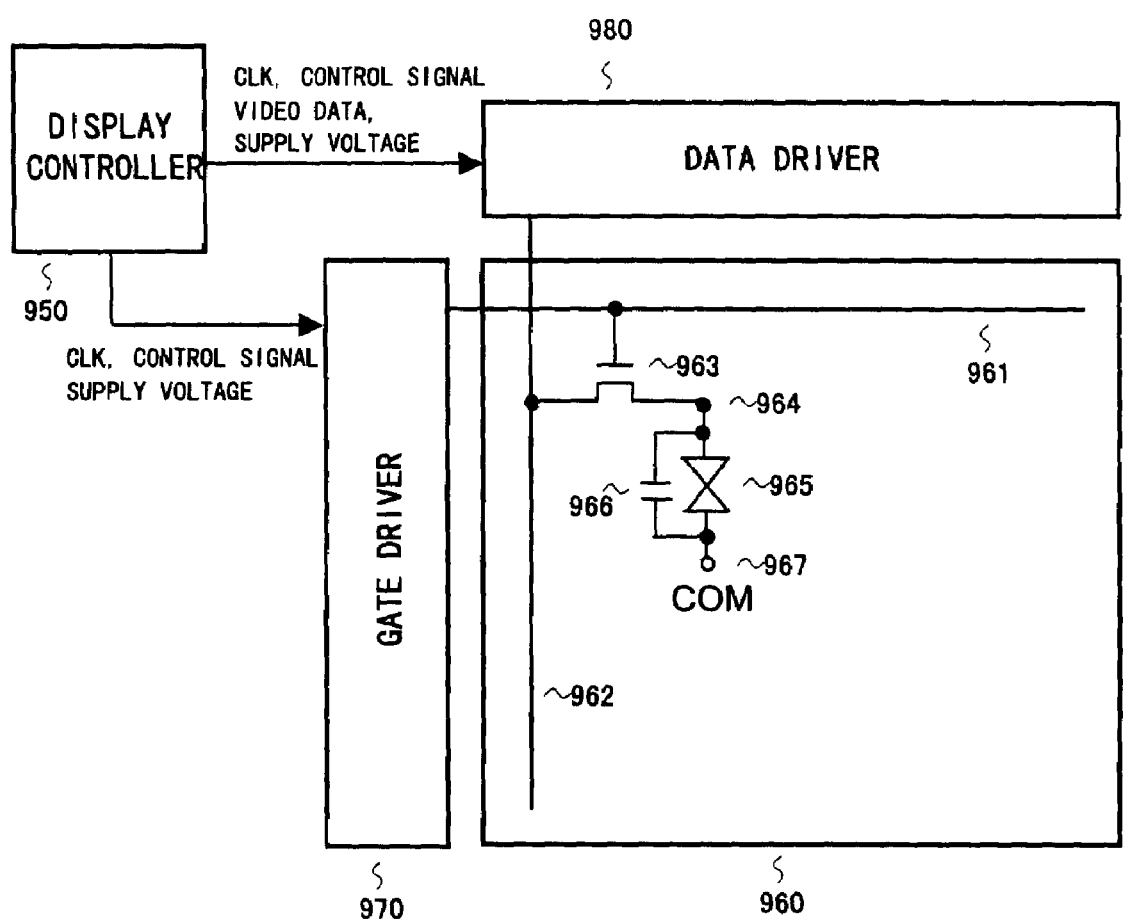
FIG. 11 is a diagram showing a liquid crystal display unit using an equivalent circuit.

When the data driver in FIG. 10 is employed as a data driver 980 in a liquid crystal display device in FIG. 11, a liquid crystal display device using multi-bit video data can be implemented at low cost.

The resistors Rf, R1, Rf1, R11, Rf2, and R12 in FIGS. 1, 2, 4, 5, and the like are not limited to passive elements. When active elements function as resistive elements, the active elements may be of course employed as the resistors Rf, R1, Rf1, R11, Rf2, and R12, respectively.

The above description was given about the present invention in connection with the embodiments described above. The present invention is not, however, limited only to the configurations of the embodiments described above, and of course includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A digital-to-analog converter circuit, comprising:
a reference voltage generation circuit that generates and outputs a plurality of reference voltages;
a decoder circuit that receives the reference voltages output from the reference voltage generation circuit, selects from among the reference voltages first to nth (where n is an integer greater than or equal to two) reference voltages inclusive of reference voltages that may be identical, based on an input digital signal, and outputs the selected first to nth reference voltages from first to nth output terminals thereof, respectively;
an amplifying circuit that receives the first to nth reference voltages output from the decoder and outputs a voltage obtained by weighted summation of the selected first to nth reference voltages; and
an amplification factor control unit that controls a voltage amplification factor of said amplifying circuit,
wherein said amplifying circuit outputs the voltage defined by a value obtained by weighted summation of the selected first to nth reference voltages and the voltage amplification factor controlled by said amplification factor control unit.

2. A data driver, comprising:
the digital-to-analog converter circuit as set forth in claim 1;
said data driver driving a data line by a voltage corresponding to the input digital signal.

3. A digital-to-analog converter circuit, comprising:
a reference voltage generation circuit that generates and outputs a plurality of reference voltages;
a decoder circuit that receives the reference voltages output from the reference voltage generation circuit, selects from among the reference voltages first to nth (where n is an integer greater than or equal to two) reference voltages inclusive of reference voltages that may be identical, based on an input digital signal, and outputs the selected first to nth reference voltages from first to nth output terminals thereof, respectively;
an amplifying circuit including:
first to nth differential circuits having first inputs of input pairs thereof connected to said first to nth output terminals of said decoder circuit, respectively; and
an amplification stage that receives output currents of said first to nth differential circuits, and performs current to voltage conversion and amplification to output the voltage from an output terminal thereof; and
an amplification factor control unit that controls a voltage amplification factor of said amplifying circuit, said amplification factor control unit being connected between said output terminal of said amplifying circuit and commonly coupled second inputs of said input pairs of said first to nth differential circuits.

4. The digital-to-analog converter circuit according to claim 3, wherein said amplification factor control unit includes:
a first resistor element connected between said output terminal of said amplifying circuit and the commonly coupled second inputs of said input pairs of said first to nth differential circuits; and
a second resistor element connected between a voltage supply and the commonly coupled second inputs of said input pairs of said first to nth differential circuits.

5. The digital-to-analog converter circuit according to claim 3, wherein said amplifying circuit outputs the voltage defined by a value obtained by weighted summation of the first to nth reference voltages and the voltage amplification factor controlled by said amplification factor control unit.

6. The digital-to-analog converter circuit according to claim 3, wherein said reference voltage generation circuit comprises a resistor string that outputs said plurality of reference voltages; and said decoder circuit comprises:
groups of switches, each groups of switches receiving the reference voltages and performing selection between first and second reference voltages from among the reference voltages based on a value at a predetermined bit position of the input digital signal, the reference voltages being outputs of said resistor string;

one of the selected first and second reference voltages being fixedly output from at least one output terminal of said decoder circuit; and selector switches, each of which selects and outputs one of the first and second reference voltages based on a value at a bit position other than the value at the predetermined bit position of the input digital signal, each of said selector switches being provided for each of output terminals other than said at least one output terminal among n output terminals of said decoder circuit.

7. The digital-to-analog converter circuit according to claim 3, wherein:

said reference voltage generation circuit comprises a resistor string that outputs (m+1) reference voltages from first through (m+1)th (m being an integer equal to or greater than two) taps thereof, said decoder circuit comprises:

a first group of switches including m switches, said first group of switches having first terminals thereof connected to said first to mth taps of said resistor string, respectively, one of said first group of switches being turned on based on a value at a predetermined bit position of the input digital signal to selectively supply a first reference voltage (Va) to commonly coupled second terminals of said first group of switches;

a second group of switches including m switches, said second group of switches having first terminals thereof connected to said second to (m+1)th taps of said resistor string, respectively, one of said second group of switches being turned on based on the value at the predetermined bit position of the input digital signal to selectively supply a second reference voltage (Vb) to commonly coupled second terminals of said second group of switches; and (n−1) (where n is an integer greater than or equal to two) selector switches each of which switches and outputs one of the first reference voltage (Va) at a connecting node of said commonly coupled second terminals of said first group of switches and the second reference voltage (Vb) at a connecting node of said commonly coupled second terminals of said second group of switches, based on a value at a bit position other than the predetermined bit position of the input digital signal, said connecting node of said commonly coupled second terminals of said first group of switches constitutes said first output terminal of said decoder circuit, outputs of said (n−1) selector switches constitute said second through nth output terminals of said decoder circuit, respectively, and non-inverting input terminals of said input pairs of said first to nth differential circuits are connected to said first to nth output terminals of said decoder circuit, respectively, said non-inverting input terminals constituting said first inputs of said input pairs of said first to nth differential circuits.

8. The digital-to-analog converter circuit according to claim 3, wherein in said amplifying circuit, said first to nth differential circuits comprise first to nth differential pairs, said first to nth differential pairs being driven by corresponding current sources, respectively, first outputs of output pairs of said first to nth differential pairs being connected in common, second outputs of said output pairs of said first to nth differential pairs being connected in common, said output pairs being connected to a common load circuit, and wherein said amplification stage includes an amplifying unit, an input terminal of said amplifying unit being connected to at least one of a connecting node between the first outputs of said output pairs of said first to nth differential pairs and said load circuit and a connecting node between the second outputs of said output pairs of said first to nth differential pairs and said load circuit, an output terminal of said amplifying unit being connected to said output terminal of said amplifying circuit.

9. A data drivers, comprising:

a positive-polarity reference voltage generation circuit that generates a plurality of positive-polarity reference voltages;

a positive-polarity decoder that receives the positive-polarity reference voltages and selects first to nth (where n is an integer greater than or equal to two) positive-polarity reference voltages inclusive of reference voltages that may be identical from among the positive-polarity reference voltages, based on a first input digital signal to output the selected first to nth positive-polarity reference voltages from first to nth output terminals thereof, respectively;

a positive-polarity amplifier that receives the selected first to nth positive-polarity reference voltages and outputs a positive-polarity gray scale voltage from a positive-polarity output terminal thereof;

a negative-polarity reference voltage generation circuit that generates a plurality of negative-polarity reference voltages;

a negative-polarity decoder that receives the negative-polarity reference voltages and selects first to nth (where n is an integer greater than or equal to two) negative-polarity reference voltages inclusive of reference voltages that may be identical from among the negative-polarity reference voltages, based on a second input digital signal to output the selected first to nth negative-polarity reference voltages from first to nth output terminals thereof, respectively;

a negative-polarity amplifier that receives the selected first to nth negative-polarity reference voltages and outputs a negative-polarity gray scale voltage from a negative-polarity output terminal thereof; and an output switch circuit that switches and controls whether to directly connect said positive-polarity output terminal and said negative-polarity output terminal to first and second data lines, respectively, without alteration or to cross-connect said positive-polarity output terminal and said negative-polarity output terminal to said second data line and said first data line, respectively, wherein said positive-polarity amplifier comprises:

a positive-polarity amplifying circuit including:

first to nth positive-polarity differential circuits with first inputs of input pairs thereof connected to said first to nth output terminals of said positive-polarity decoder, respectively;

a first amplification stage that receives output currents of said first to nth positive-polarity differential circuits, and performs current to voltage conversion and amplification to output the positive-polarity gray scale voltage from said positive-polarity output terminal; and a positive-polarity amplification factor control unit that controls a voltage amplification factor of said positive-polarity amplifying circuit, said positive-polarity amplification factor control unit being connected between said positive-polarity output terminal and commonly coupled second inputs of said input pairs of said first to nth positive-polarity differential circuits, and wherein said negative-polarity amplifier comprising:
a negative-polarity amplifying circuit including:
first to nth negative-polarity differential circuits with first inputs of input pairs thereof connected to said first to nth output terminals of said negative-polarity decoder, respectively;
a second amplification stage that receives output currents of said first to nth negative-polarity differential circuits, and performs current to voltage conversion and amplification to output the negative-polarity gray scale voltage from said negative-polarity output terminal; and
a negative-polarity amplification factor control unit that controls a voltage amplification factor of said negative-polarity amplifying circuit, said negative-polarity amplification factor control unit being connected between said negative-polarity output terminal and commonly coupled second inputs of said input pairs of said first to nth negative-polarity differential circuits;
a conductivity type of said positive-polarity differential circuits being set to be opposite to a conductivity type of said negative-polarity differential circuits.

10. The data driver according to claim 9, wherein said positive-polarity amplification factor control unit includes:
a first resistor element connected between said positive-polarity output terminal and the commonly coupled second inputs of said input pairs of said first to nth positive-polarity differential circuits; and
a second resistor element connected between the commonly coupled second inputs of said input pairs of said first to nth positive-polarity differential circuits and a first voltage supply,
wherein said negative-polarity amplification factor control unit includes:
a third resistor element connected between said negative-polarity output terminal and the commonly coupled second inputs of said input pairs of said first to nth negative-polarity differential circuits; and
a fourth resistor element connected between the commonly coupled second inputs of said input pairs of said first to nth negative-polarity differential circuits and a second voltage supply.

11. The data driver according to claim 9, wherein said positive-polarity amplifier outputs the voltage defined by a value obtained by weighted summation of the first to nth positive-polarity reference voltages and the voltage amplification factor controlled by said positive-polarity amplification factor control unit, and
wherein said negative-polarity amplifier outputs the voltage defined by a value obtained by weighted summation of the first to nth negative-polarity reference voltages and the voltage amplification factor controlled by said negative-polarity amplification factor control unit.

12. The data driver according to claim 9, wherein:
said positive-polarity reference voltage generation circuit comprises a positive-polarity resistor string that outputs the positive-polarity reference voltages,
said negative-polarity reference voltage generation circuit comprises a negative-polarity resistor string that outputs the negative-polarity reference voltages, said positive-polarity decoder comprises:
a first group of switches, said switches receiving the positive-polarity reference voltages, respectively, and respectively performing selection between first and second positive-polarity reference voltages from among the positive-polarity reference voltages, based on a value at a predetermined bit position of the first input digital signal, the positive-polarity reference voltages being outputs of said positive-polarity resistor string; the selected first positive-polarity reference voltage being fixedly output from at least one output terminal of said positive-polarity decoder; and
first selector switches, each of which selects and outputs one of the first and second positive-polarity reference voltages based on a value at a bit position other than the value at the predetermined bit position of the first input digital signal, said each of said first selector switches being provided for each of the output terminals other than said at least one output terminal among said n output terminals of said positive-polarity decoder circuit, and said negative-polarity decoder comprises:
a second group of switches, said switches receiving the negative-polarity reference voltages, respectively, and respectively performing selection between first and second negative-polarity reference voltages from among the negative-polarity reference voltages, based on a value at a predetermined bit position of the second input digital signal, the negative-polarity reference voltages being outputs of said negative-polarity resistor string; the selected first negative-polarity reference voltage being fixedly output from at least one output terminal of said negative-polarity decoder; and
second selector switches each of which selects and outputs one of the first and second negative-polarity reference voltages based on a value at a bit position other than the value at the predetermined bit position of the second input digital signal, said each of said second selector switches being provided for each of the output terminals other than said at least one output terminal among said n output terminals of said negative-polarity decoder.

13. The data driver according to claim 9, wherein:
said positive-polarity reference voltage generation circuit comprises a positive-polarity resistor string that outputs (m+1) positive-polarity reference voltages from first through (m+1)th (m being an integer equal to or greater than two) taps thereof; and
said negative-polarity reference voltage generation circuit comprises a negative-polarity resistor string that outputs (m+1) negative-polarity reference voltages from first through (m+1)th (where m being the integer equal to or greater than two) taps thereof,
wherein said positive-polarity decoder comprises:
a first group of positive-polarity switches comprising m switches, said first group of positive-polarity switches having first terminals thereof connected to said first to mth taps of said positive-polarity resistor string (where m being the integer equal to or greater than two), respectively, one of said first group of positive-polarity switches being turned on based on a value at a predetermined bit position of the first input digital signal to supply a first positive-polarity reference voltage (Va(+)) to commonly coupled second terminals of said first group of positive-polarity switches;
a second group of positive-polarity switches comprising m switches, said second group of switches having first terminals thereof connected to said second to (m+1)th taps of said positive-polarity resistor string, respectively, one of said second group of positive-polarity switches being turned on based on the value at the predetermined bit position of the first input digital signal to supply a second positive-polarity reference voltage (Vb(+)) to commonly coupled second terminals of said second group of positive-polarity switches; and (n−1) (where n is an integer greater than or equal to two) positive-polarity selector switches each of which switches and outputs one of the first reference voltage (Va(+)) at a connecting node of said commonly coupled second terminals of said first group of positive-polarity switches and the second positive-polarity reference voltage (Vb(+)) at a connecting node of said commonly coupled second terminals of said second group of positive-polarity switches, based on a value at a bit position other than the predetermined bit position of the first input digital signal;

said connecting node of said second terminals of said first group of positive-polarity switches constituting said first output terminal of said positive-polarity decoder;

outputs of said (n−1) positive-polarity selector switches constituting said second through nth output terminals of said positive-polarity decoder, respectively;

non-inverting input terminals of said input pairs of said first to nth positive-polarity differential circuits being connected to said first to nth output terminals of said positive-polarity decoder, respectively, said non-inverting input terminals constituting the first inputs of said input pairs of said first to nth positive-polarity differential circuits, wherein said negative-polarity decoder comprises:

a first group of negative-polarity switches comprising m switches, said first group of negative-polarity switches having first terminals thereof connected to said first to mth (where m is an integer equal to or greater than two) taps of said negative-polarity resistor string, respectively, one of said first group of negative-polarity switches being turned on based on a value at a predetermined bit position of the second input digital signal to supply a first negative-polarity reference voltage (Va(−)) to commonly coupled second terminals of said first group of negative-polarity switches;

a second group of negative-polarity switches comprising m switches, said second group of negative-polarity switches having first terminals thereof connected to said second to (m +1)th taps of said negative-polarity resistor string, respectively, one of said second group of negative-polarity switches being turned on based on the value at the predetermined bit position of the second input digital signal to supply a second negative-polarity reference voltage (Vb(−)) to commonly coupled second terminals of said second group of negative-polarity switches; and (n−1) (where n is an integer greater than or equal to two) selector switches each of which switches and outputs one of the first negative-polarity reference voltage (Va(−)) at a connecting node of said commonly coupled second terminals of said first group of negative-polarity switches and the second negative-polarity reference voltage (Vb(−)) at a connecting node of said commonly coupled second terminals of said second group of negative-polarity switches, based on a value at a bit position other than the predetermined bit position of the second input digital signal;

said connecting node of said commonly coupled second terminals of said first group of negative-polarity switches constituting said first output terminal of said negative-polarity decoder;

outputs of said (n−1) negative-polarity selector switches constituting said second through nth output terminals of said negative-polarity decoder, respectively;

non-inverting input terminals of said input pairs of said first to nth negative-polarity differential circuits being connected to said first to nth output terminals of said negative-polarity decoder, respectively, said non-inverting input terminals constituting the first inputs of said input pairs of said first to nth negative-polarity differential circuits.

14. The data driver according to claim 9, wherein:

in said positive-polarity amplifier, said first to nth positive-polarity differential circuits comprise first to nth positive-polarity differential pairs driven by corresponding current sources, respectively, first outputs of output pairs of said first to nth positive-polarity differential pairs being connected in common and second outputs of said output pairs of said first to nth positive-polarity differential pairs being connected in common, said output pairs being connected in common to a first load circuit, and wherein said first amplification stage of said positive-polarity amplifying circuit includes a first amplifying unit, an input terminal of said first amplifying unit being connected to at least one of a connecting node between the first outputs of said output pairs of said first to nth positive-polarity differential pairs and said first load circuit and a connecting node between the second outputs of said output pairs of said first to nth positive-polarity differential pairs and said first load circuit, an output terminal of said amplifying unit being connected to said positive-polarity output terminal, and wherein in said negative-polarity amplifier, said first to nth negative-polarity differential circuits comprise first to nth negative-polarity differential pairs driven by corresponding current sources, respectively, first outputs of output pairs of said first to nth negative-polarity differential pairs being connected in common and second outputs of said output pairs of said first to nth negative-polarity differential pairs being connected in common, said output pairs being connected in common to a second load circuit, and said second amplification stage of said negative-polarity amplifying circuit includes a second amplifying unit, an input terminal of said second amplifying unit being connected to at least one of a connecting node between the first outputs of said output pairs of said first to nth negative-polarity differential pairs and said second load circuit and a connecting node between the second outputs of said output pairs of said first to nth negative-polarity differential pairs and said second load circuit, an output terminal of said amplifying unit being connected to said negative-polarity output terminal.

15. The data driver according to claim 9, wherein a high potential side voltage supply VDD and a low potential side voltage supply VSS are supplied to said positive-polarity amplifier and said negative-polarity amplifier, respectively, as driving voltage supplies, and an opposing substrate electrode voltage VCOM of a display panel is substantially intermediate between the high potential side voltage supply VDD and the low potential side voltage supply VSS.

16. The data driver according to claim 9, wherein: a reference voltage supply VSS is set to be substantially an opposing substrate electrode voltage VCOM of a display panel, wherein the reference voltage supply VSS and a high potential side voltage supply VDD2 higher than the reference voltage supply VSS are supplied to said positive-polarity amplifier as a driving voltage supply, and wherein the reference voltage supply VSS and a low potential side voltage supply VDD1 lower than the reference voltage supply VSS are supplied to said negative-polarity amplifier as a driving voltage supply.

17. A display device including the data driver as set forth in claim 9.

* * * * *